United States Patent
Mauder et al.

(10) Patent No.: US 7,947,569 B2
(45) Date of Patent: May 24, 2011

(54) METHOD FOR PRODUCING A SEMICONDUCTOR INCLUDING A FOREIGN MATERIAL LAYER

(75) Inventors: Anton Mauder, Kolbermoor (DE); Frank Pfirsch, Munich (DE); Rudolf Berger, Regensburg (DE); Stefan Sedlmaier, Munich (DE); Wolfgang Lehnert, Lintach (DE); Raimund Foerg, Straubing (DE)

(73) Assignee: Infineon Technologies Austria AG, Villach (AT)

( * ) Notice: Subject to any disclaimer, the term of this patent is extended or adjusted under 35 U.S.C. 154(b) by 8 days.

(21) Appl. No.: 12/164,652

(22) Filed: Jun. 30, 2008

(65) Prior Publication Data

US 2009/0325361 A1    Dec. 31, 2009

(51) Int. Cl.
*H01L 21/76* (2006.01)

(52) U.S. Cl. .......... 438/429; 438/44; 438/226; 438/245; 438/269; 438/357; 438/360; 438/388; 438/413; 438/416; 438/424; 438/695; 438/699; 438/700; 257/E29.012; 257/E21.257; 257/E21.546; 257/E21.548; 257/E21.564

(58) Field of Classification Search ............... 438/226, 438/245, 269, 357, 360, 388, 413, 416, 424, 438/695, 696, 699, 700; 257/E29.256, E29.257, 257/26, E21.012, 545, 546, 548, 549, 55, 257/564, 256

See application file for complete search history.

(56) References Cited

U.S. PATENT DOCUMENTS

| | | | |
|---|---|---|---|
| 5,008,208 A | 4/1991 | Liu | |
| 5,212,110 A | 5/1993 | Pfiester | |
| 5,494,837 A | 2/1996 | Subramanian | |
| 5,994,718 A | 11/1999 | Demirlioglu | |
| 6,018,174 A | 1/2000 | Schrems et al. | |
| 6,124,612 A | 9/2000 | Tihanyi et al. | |
| 6,184,107 B1 | 2/2001 | Dirakaruni et al. | |
| 7,015,145 B2 * | 3/2006 | Jaiprakash et al. | 438/700 |
| 2005/0045996 A1 * | 3/2005 | Yamauchi et al. | 257/627 |
| 2005/0167744 A1 * | 8/2005 | Yilmaz | 257/329 |
| 2007/0023830 A1 * | 2/2007 | Pfirsch et al. | 257/341 |
| 2008/0197441 A1 | 8/2008 | Mauder et al. | |
| 2009/0046493 A1 * | 2/2009 | Assefa et al. | 365/87 |
| 2009/0218621 A1 | 9/2009 | Pfirsch et al. | |
| 2009/0325361 A1 | 12/2009 | Mauder et al. | |

FOREIGN PATENT DOCUMENTS

| | | |
|---|---|---|
| DE | 19801313 | 7/1999 |
| DE | 102005035153 | 2/2007 |
| DE | 102007004320 | 7/2008 |

(Continued)

OTHER PUBLICATIONS

Bell, T.E. et al., "Porous Silicon as a Sacrificial Material," J. Micromech. Microeng., vol. 6, pp. 361-369 (1996).

(Continued)

*Primary Examiner* — Charles D Garber
*Assistant Examiner* — Yasser A Abdelaziez
(74) *Attorney, Agent, or Firm* — Dicke, Billig & Czaja, PLLC

(57) ABSTRACT

A method for producing a semiconductor including a material layer. In one embodiment a trench is produced having two opposite sidewalls and a bottom, in a semiconductor body. A foreign material layer is produced on a first one of the two sidewalls of the trench. The trench is filled by epitaxially depositing a semiconductor material onto the second one of the two sidewalls and the bottom of the trench.

22 Claims, 19 Drawing Sheets

FOREIGN PATENT DOCUMENTS

WO    2007012490 A2    2/2007

OTHER PUBLICATIONS

Siffert, P. et al., "Silicon-Evolution and Future of a Technology," Springer Berlin Heidelberg New York, pp. 159-167 (2004).

Goesele, U. et al., Excerpt of "Science and Technology of Semiconductor Wafer Bonding," Max-Planck-Institute of Microstructure Physics, Halle & School of Engineering, Duke University, Durham, North Carolina, pp. 1. <http://www.duke.edu/web/wbl/ch7/ch7-hpge.html#7.3.1.5>, 2009 (1 pg.).

Office Action mailed Jun. 1, 2010 relative to U.S. Appl. No. 12/241,828.

Notice of Allowance mailed Sep. 21, 2010 relative to U.S. Appl. No. 12/241,828.

* cited by examiner

A - A

A - A

US 7,947,569 B2

METHOD FOR PRODUCING A SEMICONDUCTOR INCLUDING A FOREIGN MATERIAL LAYER

BACKGROUND

When producing semiconductor components, it is necessary in many cases to produce a foreign material layer, that is to say a material layer which is not composed of a semiconductor material, in a semiconductor body. Such material layers are dielectric layers, for example, which are used as capacitor dielectric in capacitors or as gate dielectric or field plate dielectric in MOS transistors. Such material layers can furthermore also be composed of a conductive material such as, for example, a metal or a metal-semiconductor compound.

In order to produce a foreign material layer extending in a vertical direction in a semiconductor body, it is possible to produce a trench that is subsequently filled with the desired foreign material. However, producing very thin layers which additionally extend deeply into the semiconductor body is difficult by using such a method since trenches having a high aspect ratio (ratio of depth to width of the trench) would have to be produced for this purpose. Such trenches having a high aspect ratio either can only be produced in a costly manner or cannot be economically produced at all above a specific aspect ratio, for example, greater than 1000:1.

In vertical power components, for example, which include a drift zone and a drift control zone arranged adjacent to the drift zone, which are dielectrically insulated from one another by a drift control zone dielectric, very thin foreign material layers are required as drift control zone dielectric. In these components, the drift zone—and also the drift control zone—serves for taking up a reverse voltage when the component is driven in the off state, and the drift control zone serves for controlling a conducting channel in the drift zone when the component is driven in the on state. In this case, the thickness of the drift control zone dielectric should be as small as possible in order to enable the conducting channel to be controlled effectively. Furthermore, the drift control zone dielectric should extend in a vertical direction over the entire length of the drift zone.

SUMMARY

One embodiment provides a method for producing a semiconductor component having a foreign material layer arranged in a semiconductor body, the method includes producing a trench, having two opposite sidewalls and a bottom, in the semiconductor body. An auxiliary material layer is produced on a first one of the two sidewalls of the trench. The trench is filled by epitaxially depositing a semiconductor material onto the second one of the two sidewalls and the bottom of the trench.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
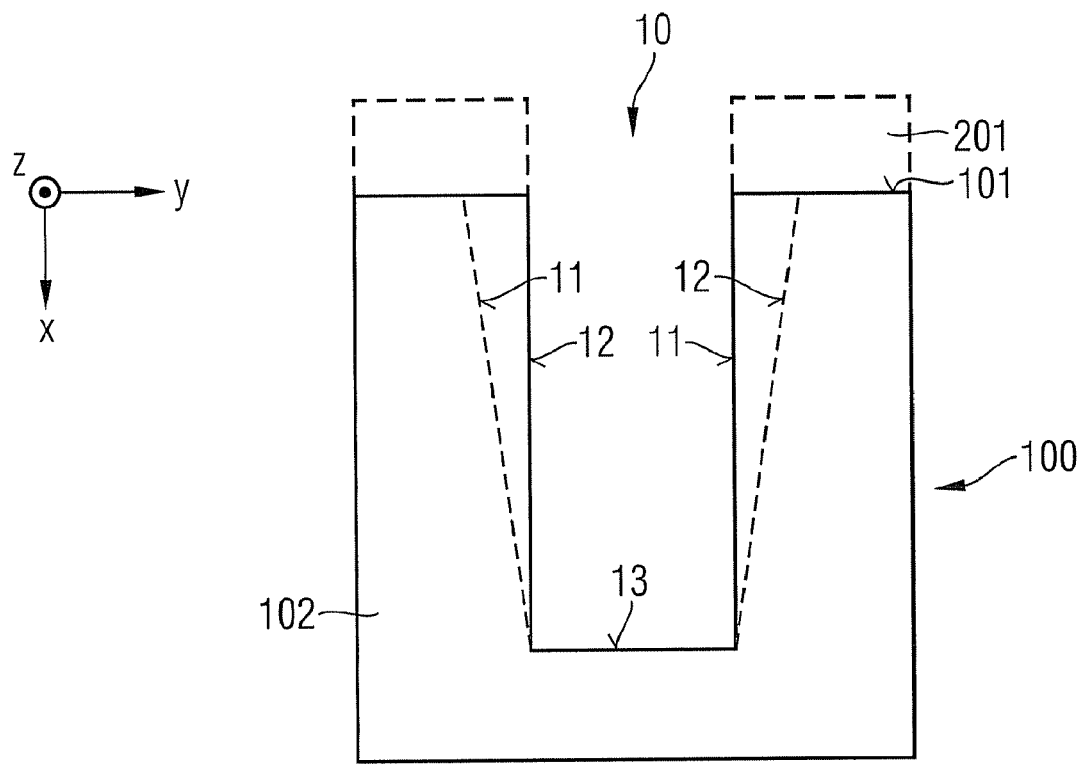
FIGS. 1A-1D illustrate one embodiment of a method for producing a material layer in a semiconductor body on the basis of vertical cross sections through the semiconductor body during different method processes.
Figure 1B:
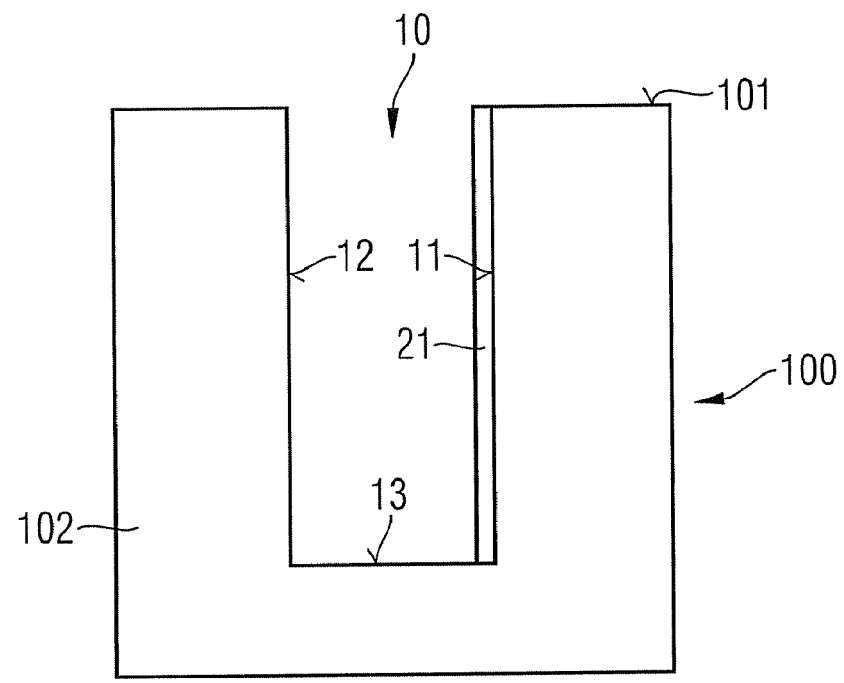
Figure 1C:
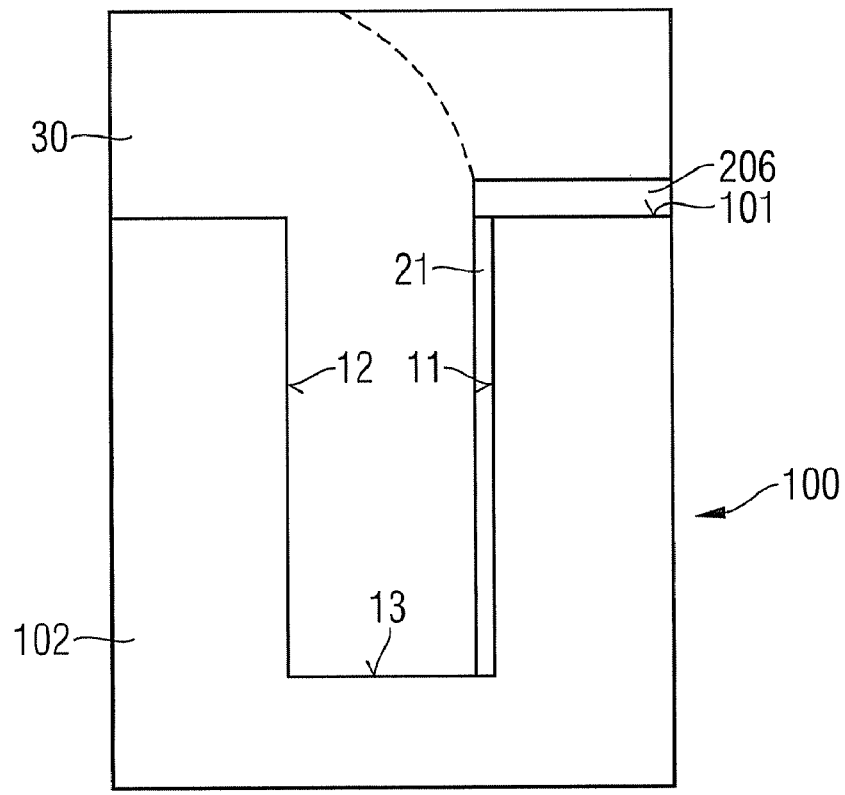

FIGS. 1A to 1C illustrate one embodiment of a method for producing a foreign material layer in a semiconductor body 100. For elucidating the method, FIGS. 1A to 1C each schematically illustrate a cross section through part of the semiconductor body 100. The semiconductor body 100 has a first side 101; the sectional plane illustrated in the figures is a vertical sectional plane and thus runs perpendicular to the first side 101.

The semiconductor body 100 has an extent in a vertical direction x. Referring to FIG. 1A, that is the direction running perpendicular to the first side 101. The semiconductor body 100 additionally has an extent in a first lateral direction y and in a second lateral direction z, which each run perpendicular to the vertical direction x. In the figures, the first lateral direction y is, for example, a direction running in the plane of the drawing perpendicular to the vertical direction x. In the figures, the second lateral direction z runs, for example, perpendicular to the plane of the drawing illustrated and perpendicular to the vertical direction x. Unless explicitly indicated otherwise in the explanation below, "lateral direction" always denotes the first lateral direction y illustrated in the figures.

The method explained below serves for producing a foreign material layer extending into the semiconductor body 100 in a vertical direction. In this case, such a "vertical extension" should be understood to mean that a direction in which the foreign material layer extends has at least one direction component that runs in a vertical direction x of the semiconductor body 100. Referring to the previous explanations, therefore, a foreign material layer having a vertical extension should be understood to mean a layer which runs perpendicular to the first side 101. However, a foreign material layer extending in a vertical direction should also be understood hereinafter to mean such a layer which runs "obliquely" with respect to the first side 101, that is to say which has both a direction component in a vertical direction x and a direction component in the first lateral direction y. In this case, the smaller of the two angles which the foreign material layer in this case forms with the first side 101 is in one embodiment greater than 45°.

In connection with the explanation below, a "foreign material layer" should be understood to mean a layer composed of a material which differs from the material of the semiconductor body 100. In this case, the difference can consist in the type of the material itself or in the doping of the material. This layer is, for example, a dielectric layer, such as e.g., an oxide or a nitride, a layer composed of an electrically conductive material, such as e.g., a layer composed of a metal or a metal-semiconductor compound, such as e.g., a silicide, or a layer composed of a different semiconductor material than that of the semiconductor body. The foreign material layer can also be a layer composed of the same material as the semiconductor body, which layer differs with regard to its doping from the doping of the semiconductor body in the region in which the foreign material layer is formed.

Referring to FIG. 1A, the method for producing the foreign material layer includes producing a trench 10 extending into the semiconductor body proceeding from the first side 101. The trench 10 has first and second sidewalls 11, 12 opposite one another, and a bottom 13. The trench 10 has, apart from an extent in the vertical direction x, an extent in the first lateral direction y and an extent in the second lateral direction z. The extent of the trench 10 in the vertical direction x is referred to hereinafter as depth, the extent in the first lateral direction y is referred to hereinafter as width of the trench, and the extent in the second lateral direction z is referred to hereinafter as length of the trench. In this case, the length of the trench, which is not explicitly illustrated in FIGS. 1A to 1C, is greater than the width of the trench.

The trench 10 can be produced in such a way that its sidewalls 11, 12 run perpendicular to the first side 101, as is illustrated on the basis of a solid line in FIG. 1A. However, the trench 10 can also be produced in such a way that its sidewalls run obliquely with respect to the first side 101, such that the width of the trench proceeding from the first side 101 decreases as the depth of the trench increases. Such a trench having beveled sidewalls is illustrated by dash-dotted lines in FIG. 1A. The type of trench—whether with sidewalls running perpendicular or with beveled sidewalls—is dependent on the production method by which the trench 10 is produced. Furthermore, a trench can also have two or more trench sections, of which some run perpendicular to the first side and others run obliquely with respect to the first side. In one embodiment, it is possible to provide a plurality of sections running perpendicular and a plurality of sections running obliquely which alternate with one another in a vertical direction.

The trench form, that is to say whether with obliquely running sidewalls or with perpendicular sidewalls, is dependent on the type of the etching method or etching process employed for producing the trench. When a dry-chemical etching process is used, the trench form is dependent on the process parameters such as composition of the etching gas, pressure, temperature, gas flows, etc.

The trench 10 is produced, for example, by using an etching method using a mask 201 applied to the first side 101 of the semiconductor body 100. The mask has a cutout that determines the position of the trench and the dimensions thereof in the lateral directions y, z. The etching method by which the trench 10 is etched into the semiconductor body 100 is an anisotropic etching method, for example.

The width of the trench is, for example, between 0.2 µm and 10 µm, in one embodiment between 0.2 µm and 5 µm. The depth of the trench is, for example, between 10 µm and 100 µm, in one embodiment between 20 µm and 80 µm. However, the depth can also be greater than the 100 µm indicated.

The semiconductor body is composed, for example, of a monocrystalline semiconductor material, such as e.g., silicon. As is known, semiconductor crystals have different crystal planes. When silicon is used as material for the semiconductor body 100, the trench 10 is produced, for example, in such a way that that sidewall of the trench on which the foreign material layer still to be explained below is produced runs completely or at least in sections in a <010> crystal plane of the crystal lattice. For specific foreign material layers, such as e.g., foreign material layers composed of a semiconductor oxide, an orientation of the sidewall in the crystal plane is favorable because interface states and fixed charges of the oxide can thereby be minimized, which can have a positive influence on the blocking properties of the component produced. Moreover, the crystal plane can have a favorable effect on the crystal quality during later epitaxial growth that is still to be explained. An exact orientation of the trench sidewall with respect to the <010> plane is not necessary, rather a misorientation or deviation with respect to the <010> plane which amounts to at most 15°, for example, can be tolerated.

Referring to FIG. 1B, after the trench 10 has been produced, a foreign material layer 21 composed of a material which differs from the material of the semiconductor body is produced on a first one of the two sidewalls 11, 12 of the trench 10. In the example illustrated, the foreign material layer 21 extends over the entire length of the first sidewall 11 from the first side 101 as far as the bottom 13 of the trench 10. A thickness of the foreign material layer, that is to say the dimension thereof in the first lateral direction y, is between 10 nm and 200 nm, for example. The foreign material layer 21 is composed, for example, of a dielectric material, such as, for example, an oxide or a nitride. However, the foreign material layer can also be composed of an electrically conductive material, such as, for example, a metal or a metal-semiconductor compound. In this case, the thickness of the foreign material layer is dependent, in one embodiment, on the production conditions under which the layer 21 is produced.

The foreign material layer 21 can already be a desired material layer that finally remains in the semiconductor body 100. In a manner still to be explained, the foreign material layer 21 can be removed again at another point in time in the method and be replaced by a further foreign material layer, which ultimately remains in the semiconductor body and which is composed of a material that differs from the material of the semiconductor body 100.

Referring to FIG. 1C, after the foreign material layer 21 has been produced, the trench 10 is filled by a semiconductor layer 30 being deposited epitaxially on the second sidewall 12, opposite the first sidewall 11, and the bottom 13 of the trench 10. FIG. 1C illustrates the semiconductor body 100 after the semiconductor layer 30 has been deposited. The deposition process is carried out until the trench 10 has been completely filled with semiconductor material, that is to say has been completely "grown over" with semiconductor material proceeding from the second side 12 and the bottom 13 of the original trench 10.

Figure 1D:
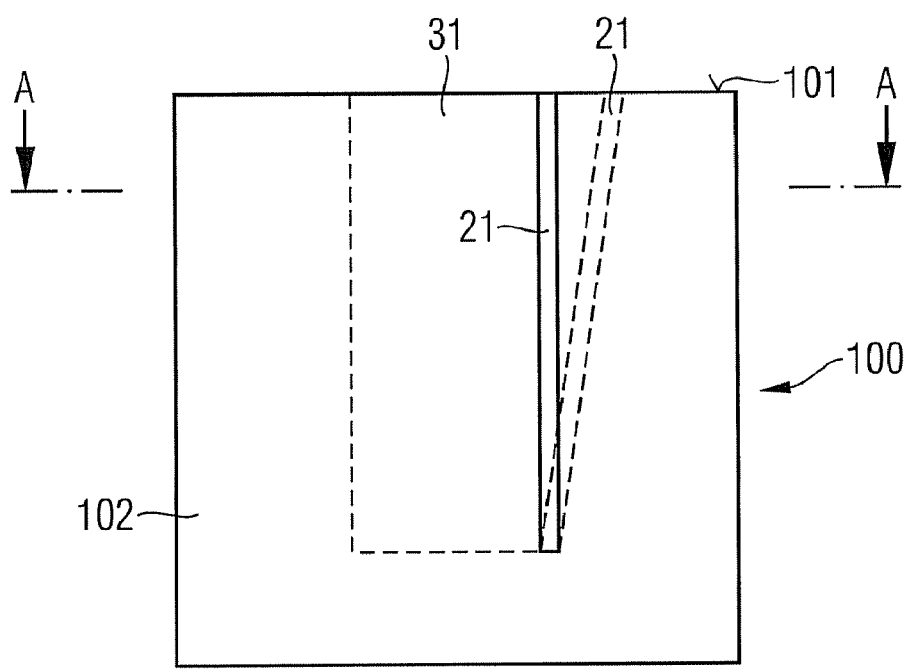

By using the deposition process, semiconductor material is also applied to the first side 101 of the semiconductor body. This semiconductor material applied to the first side 101 can subsequently be removed, the result of which is illustrated in FIG. 1D. The semiconductor material is removed from the first side 101 of the semiconductor body, for example, by using etching, polishing or grinding processes that are known in principle. The semiconductor material applied to the first side 101 is removed in one embodiment to an extent until the foreign material layer 21 previously produced on the first sidewall 11 is uncovered in sections on the first side 101.

In order to save semiconductor material, or in order to have to remove only little semiconductor material from the first side 101 of the semiconductor body 100, during the deposition of the semiconductor layer 30 the first side 101 can be protected against the application of the epitaxial layer at least in sections by using a mask layer. Such a mask layer is illustrated in dashed fashion in FIG. 1C and designated by the reference symbol 206. The dashed line in FIG. 1C illustrates the dimensions of the semiconductor layer 30 in a lateral direction for the case where such a mask layer is present above the first side 101 adjacent to one of the sidewalls—the first sidewall 11 in the example. The epitaxial layer is deposited, for example, by using a selective epitaxy process, which ensures that the epitaxial layer is produced only on uncovered regions of the semiconductor body, but not on the mask layer and the foreign material layer 21. The mask layer 206 can be composed, for example, of the same material as the foreign material layer 21.

In a manner not illustrated in more specific detail, there is also the possibility of providing a mask layer which is arranged on the first side 101 adjacent to both trench sidewalls 11, 12. This mask is, for example, the mask 201 which has already been explained with reference to FIG. 1A and which serves for producing the trench 10 and which remains on the front side 101 during the remaining method processes up to the epitaxy method. The mask 201 can be a hard mask, such as e.g., an oxide mask. No semiconductor material grows on the mask 201 during the later selective epitaxial filling of the trench 10, whereby less semiconductor material has to be polished back during the planarization. One advantage of not etching the mask 201 after the etching of the trench 10 on the first side 101 is that an anisotropic etching back required for removing the mask 201 would lead to intensified crystal damage of the trench bottom 13. Such crystal damage of the trench bottom would disturb the growth of the epitaxial filling. These problems do not occur if the mask 201 remains on the front side 101 until after the epitaxial filling of the trench 10 and only then is removed.

The result of the method processes explained above is a monocrystalline semiconductor body 100 in which is arranged a foreign material layer 21 extending into the semiconductor body in a vertical direction proceeding from the first side 101. The dimensions of the original trench 10 are illustrated in a dashed manner in FIG. 1D only for the sake of understanding. The reference symbol 31 in FIG. 1D designates those semiconductor regions of the semiconductor body 100 which were produced by epitaxial deposition of semiconductor material in the trench. The reference symbol 102 in FIGS. 1A to 1D designates sections of the semiconductor body 100 which were already present before the production of the semiconductor trench 10. The epitaxially deposited semiconductor layer 30 can have the same doping as the "original" regions 102 of the semiconductor body 100, but can also be doped differently with respect thereto. The dash-dotted lines in FIG. 1D illustrate an auxiliary material layer 21, which is obtained by the method processes explained above when an obliquely running trench 10 is produced at the beginning of the method.

A foreign material layer 21 having a high aspect ratio can be produced rapidly and cost-effectively by using the method explained above. The aspect ratio of the auxiliary material layer 21 is determined by the thickness with which the auxiliary material layer 21 is produced on the first sidewall 11 of the trench, and is determined by the depth of the trench 10. In this method, the trench 10 itself can have a significantly smaller aspect ratio than the foreign material layer 21. Trenches having a low aspect ratio can be produced simply and cost-effectively. In the method explained, the trench is filled with a monocrystalline semiconductor material in a simple manner by using semiconductor material being deposited epitaxially on the second sidewall 12 opposite the foreign material layer 21 and on the bottom 13 of the trench. In this case, the thickness of the epitaxial layer 30 that is to be deposited in order to completely fill the trench corresponds to the width of the trench minus the thickness of the foreign material layer. The trench width lies, for example, in the range of between 0.2 μm and 10 μm. Epitaxial layers having such a thickness can be produced rapidly and cost-effectively.

As already explained, the foreign material layer 21 whose production was explained with reference to FIG. 1 can be a desired material layer that is to be produced in the semiconductor body 100 and remains in the semiconductor body 100.

Figure 2A:
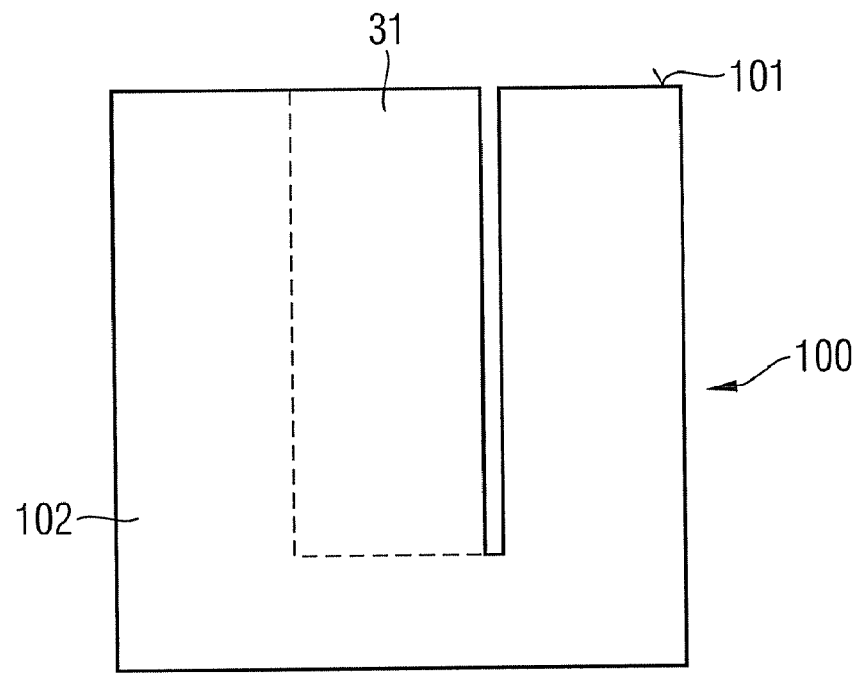
FIGS. 2A-2B illustrate one embodiment of method processes, by using which a foreign material layer that has been produced is replaced by a further foreign material layer.
Figure 2B:
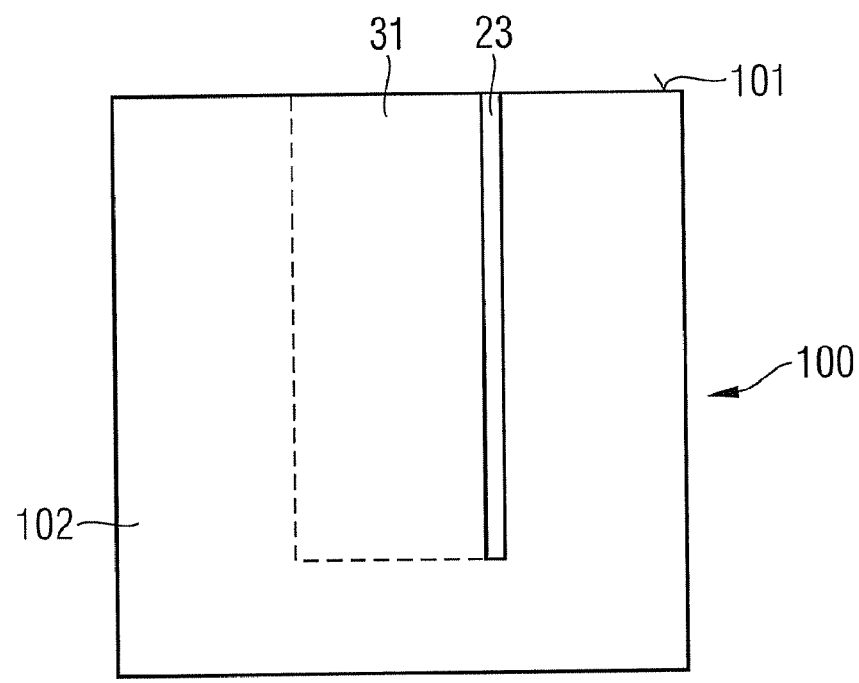

However, there is also the possibility of replacing the foreign material layer 21 by a further foreign material layer 23 after the trench has been filled with the monocrystalline semiconductor layer 30. Referring to FIG. 2A, for this purpose, after the trench has been filled with the monocrystalline semiconductor layer 30 and after optional planarization of the surface, the foreign material layer is removed from the semiconductor body 100 proceeding from the first side 101. An etching method by which the auxiliary material layer 21 is etched selectively with respect to the material of the semiconductor body 100 is suitable, for example, for removing the foreign material layer. After the foreign material layer 21 has been removed, a trench 10' thus produced is filled with the material desired for the further foreign material layer 23, the result of which is illustrated in FIG. 2B. In this case, the further foreign material layer can be produced as a homogenous layer composed of one material. Furthermore, there is also the possibility of producing the further foreign material layer with a sandwich structure by using the plurality of layers being deposited or produced successively on the sidewalls and the bottom of the trench 10' produced after the removal of the foreign material layer 21. In one example, for this purpose provision is made for firstly producing an oxide layer on the sidewalls and the bottom of the trench. The oxide layer is produced, for example, by thermal oxidation. Afterward, for example, a silicon nitride layer ($Si_3N_4$), an aluminum oxide layer ($Al_2O_3$) or a layer composed of a deposited oxide can be produced. A layer stack having two or more of the last-mentioned layers can also be produced on the oxide layer. The result of such a method is a foreign material layer 23 having a high aspect ratio. In this case, the aspect ratio can correspond to the aspect ratio of the foreign material layer 21 produced first. However, the aspect ratio can also be somewhat smaller than the aspect ratio of the foreign material layer 21 produced first, namely, for example, when a thermal oxide is produced after the removal of the auxiliary material layer 21. The production of such a thermal oxide "consumed" semiconductor material in the first lateral direction, which results in a foreign material layer that is somewhat thicker than the auxiliary material layer 21 originally produced.

It should be pointed out in this connection that in all the structures explained below in which the trench 10 is filled with a semiconductor material, the first foreign material layer 21 present in these structures can be replaced by a further foreign material layer 23 in the manner explained with reference to FIG. 2.

Figure 3:
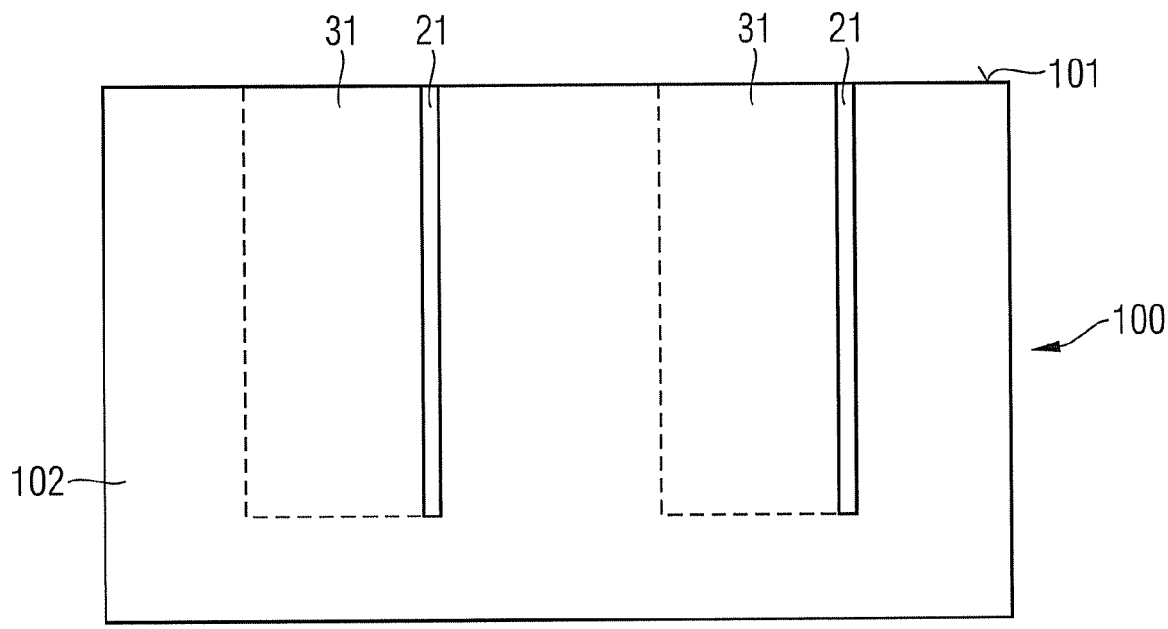
FIG. 3 illustrates, on the basis of a vertical cross section through a semiconductor body, one embodiment of a method as a result in which a plurality of material layers are produced in the semiconductor body.

It goes without saying that a plurality of foreign material layers can be produced simultaneously in the semiconductor body 100 by using the method explained above. FIG. 3 illustrates a vertical cross section through a semiconductor body 100 in which a plurality of foreign material layers 21 arranged at a distance from one another in a lateral direction were produced. FIG. 3 illustrates a semiconductor structure in which the foreign material layer was produced in each case on the same—that is to say in the present case the right-hand—sidewalls of the previously produced trenches.

Figure 4:
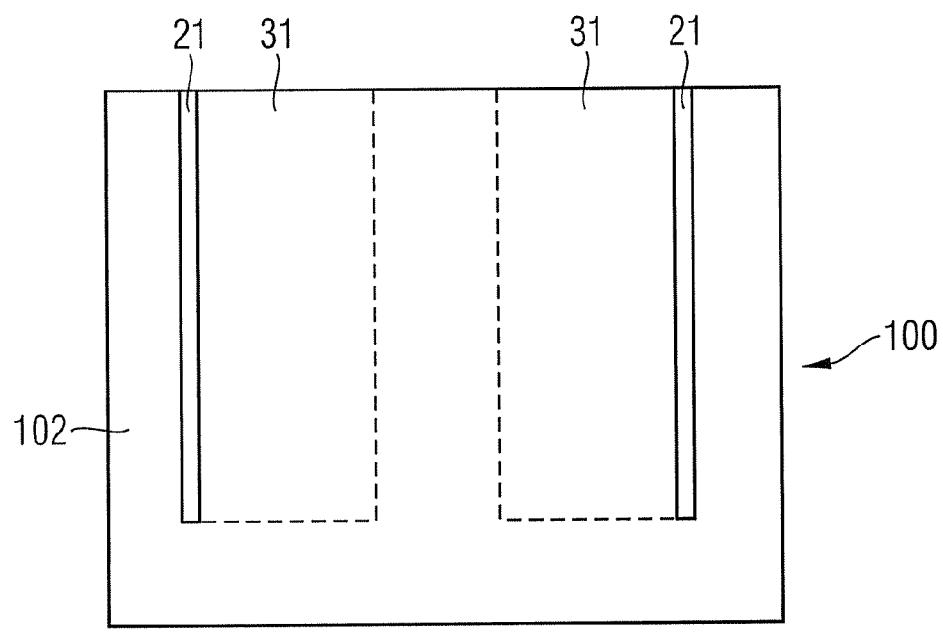
FIG. 4 illustrates, on the basis of a cross section through a semiconductor body, one embodiment of a method as a result in which a plurality of material layers are produced in the semiconductor body.

FIG. 4 illustrates a semiconductor structure in cross section in which the foreign material layers 21, prior to the trenches being filled, were produced on different trench sidewalls, that is to say on the left-hand trench sidewall in one case and on the right-hand trench sidewall in the other case.

Figure 5:
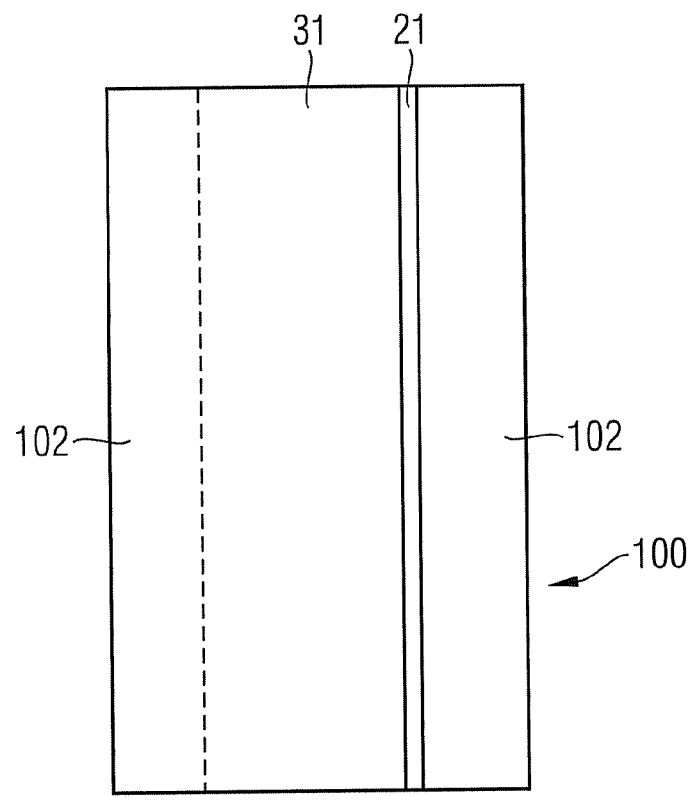
FIG. 5 illustrates a lateral cross section through the semiconductor body after producing the material layer by using a method in which an elongated trench is produced in the semiconductor body.

The trench 10 on whose first sidewall 11 the foreign material layer 21 is produced can be an elongated trench, that is to say a trench whose length is a multiple of the trench width, for example, more than hundred times the trench width. FIG. 5 illustrates a horizontal cross section through a semiconductor body 100 in which is arranged a foreign material layer 21 which was produced using such an elongated trench. For orientation, the position of the sectional plane A-A illustrated in FIG. 5 is illustrated in FIG. 1D.

Figure 6:
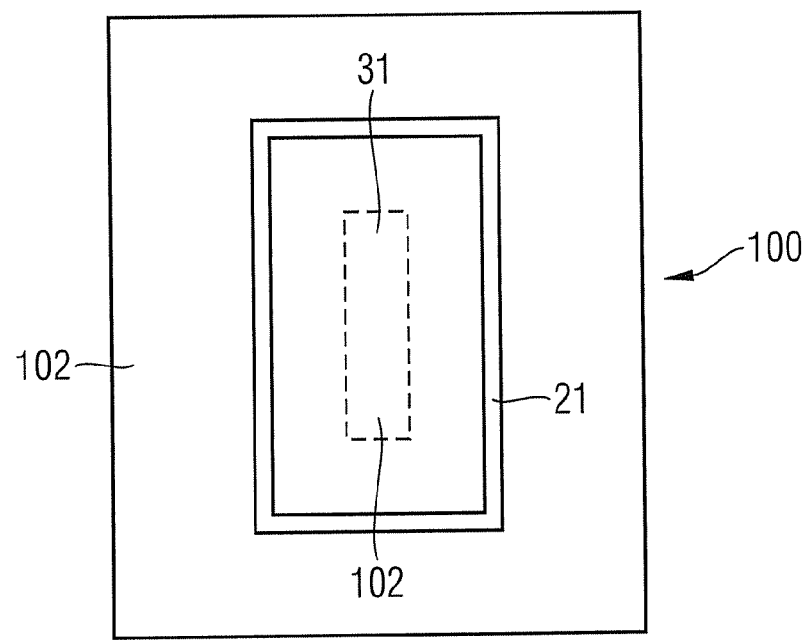
FIG. 6 illustrates a lateral cross section through the semiconductor body after producing the material layer by using a method in which a ring-shaped trench is produced in the semiconductor body.

In principle, the trench can have any desired geometry besides an elongated geometry. The trench can be in one embodiment a trench running in ring-shaped fashion. FIG. 6 illustrates a horizontal cross section through a semiconductor body 100 in which a foreign material layer 21 was produced using such a trench running in ring-shaped fashion. In the example illustrated, the trench is a trench running in rectangular fashion, such that the foreign material layer 21 has a rectangular course in the horizontal plane.

Figure 7A:
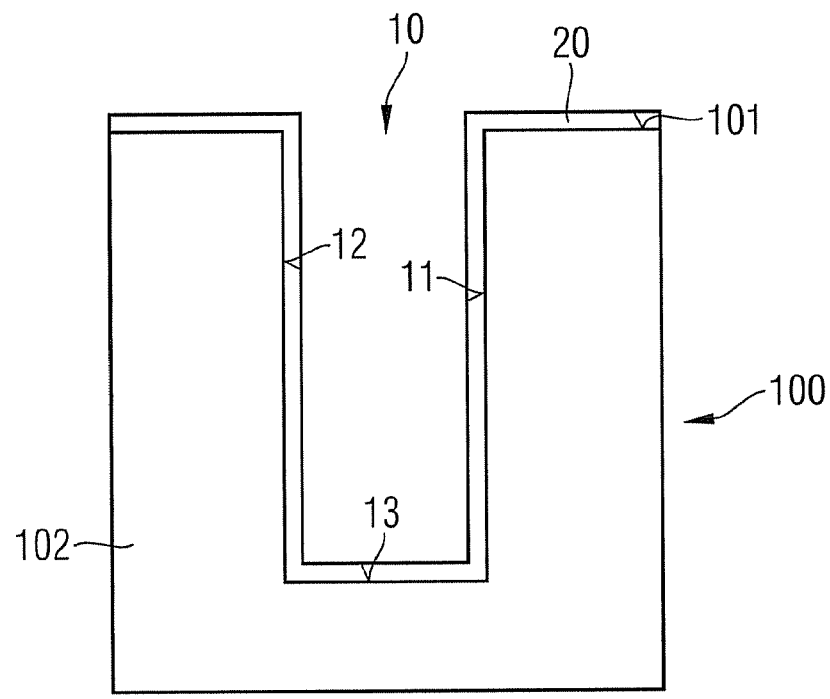
FIGS. 7A-7C illustrate one embodiment of a method for producing a material layer on only one sidewall of a trench of a semiconductor body.

One embodiment of a method for producing the foreign material layer 21 on only one of the mutually opposite sidewalls 11, 12 of the trench 10 is explained below with reference to FIGS. 7A to 7C. In this method, after the trench 10 has been produced, a foreign material layer is firstly deposited over the whole area, that is to say both on the bottom 13 and on the two mutually opposite sides 11, 12 of the trench. If the first side 101 of the trench—as in the case illustrated—is not covered by a protective layer, the foreign material layer 20 is also produced on the first side 101 of the semiconductor body 100. The foreign material layer 20 is produced, for example, by deposition of a material that is desired for the foreign material layer, such as e.g., an oxide or a nitride, or by thermal oxidation of uncovered regions of the semiconductor body 100.

In accordance with the embodiments regarding FIG. 1C, in the method explained with reference to FIGS. 7A to 7C there is the possibility of leaving a mask (201 in FIG. 1) used for producing the trench 10 on the front side 101 of the semiconductor body 100 during the method processes explained. In this case, the foreign material layer 20, above the semiconductor body 100, is not applied directly to the front side 101, but rather to the mask layer. If the foreign material layer 20 is produced by thermal oxidation, and if the mask 201 is likewise composed of oxide, then the mask 201 becomes thicker as a result owing to the thermal oxidation.

Figure 7B:
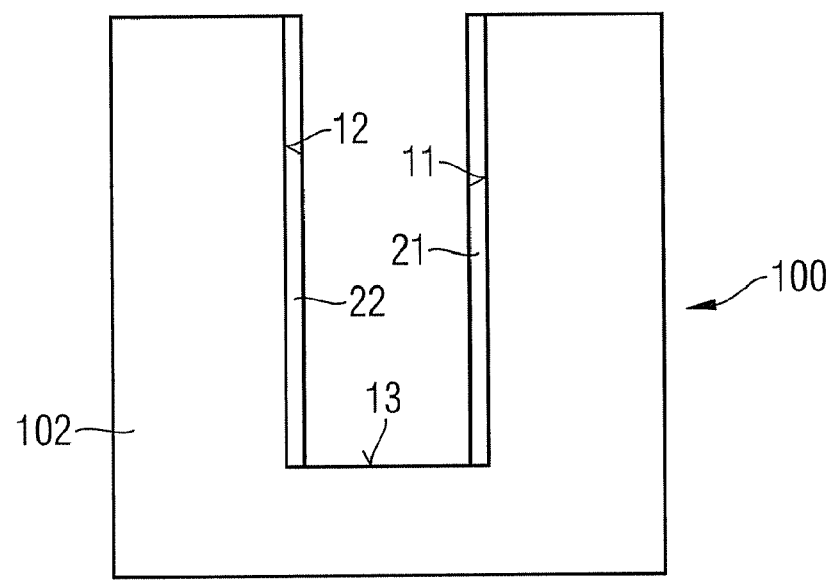

In next method processes, the result of which is illustrated in FIG. 7B, the foreign material layer 20 is removed from the bottom 13—and, if appropriate, from the first side 101—of the semiconductor body 100. An anisotropic etching method by which the foreign material layer 20 is removed from horizontal areas of the semiconductor body 100 is suitable, for example, for this purpose. The result of this method is two partial layers, a first partial layer remaining on the first sidewall 11 and a second partial layer 12 remaining on the second sidewall 12.

Figure 7C:
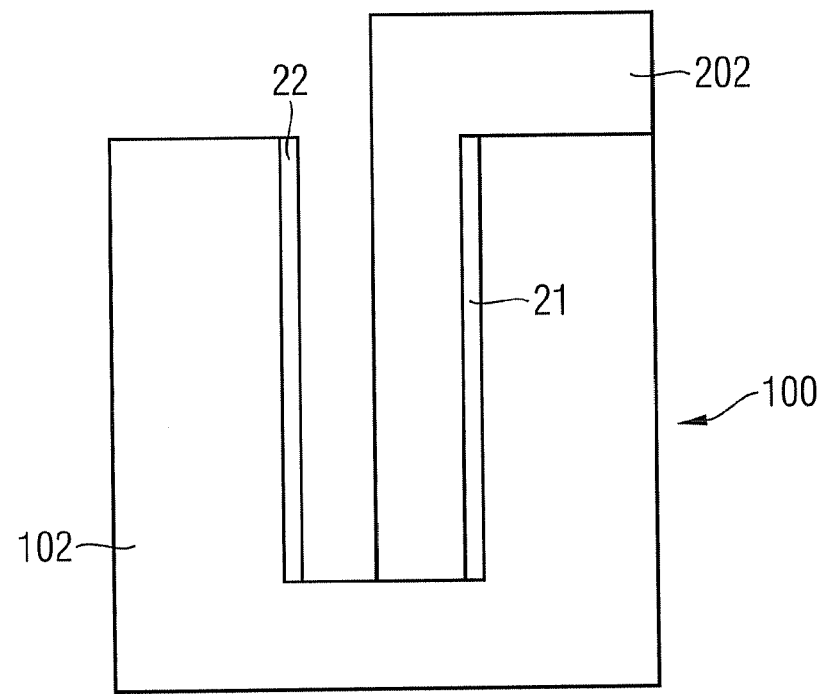

Referring to FIG. 7C, a protective layer 202 is subsequently produced, which is dimensioned such that it covers at least the first partial layer 21 of the foreign material layer but leaves the second partial layer 22 free. In the example illustrated, the protective layer 202 is produced in such a way that it leaves free part of the trench bottom 13 or of the trench 10. After the protective layer 202 has been produced, the second partial layer 22 applied to the second sidewall 12 is removed. After the partial layer 22 has been removed, the protective layer 202 can be removed. The structure illustrated in FIG. 1B arises as a result, in which structure a foreign material layer 21 has been applied only to the first sidewall 11 of the trench 10. The removal of the second partial layer 22 after the production of the protective layer 202 is effected, for example, by using an isotropic etching method that etches the second partial layer 22 selectively with respect to the material of the semiconductor body 100.

In the case explained where the mask for the etching of the trench 10 remains on the front side 101 until after the trench has been filled epitaxially, the protective layer is not applied directly (as illustrated) to the front side 101 but rather to the mask layer (201 in FIG. 1).

Figure 8:
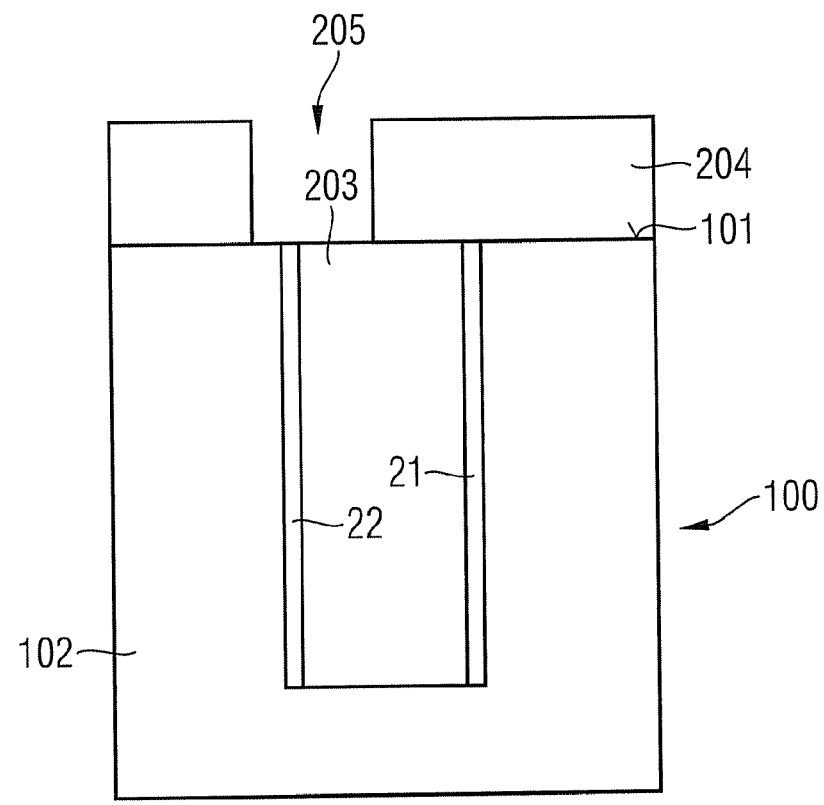
FIG. 8 illustrates one embodiment of a method for producing a material layer on only one sidewall of a trench of a semiconductor body.

FIG. 8 illustrates a further method for removing the second partial layer 22. In this method, the trench 10 is firstly filled with a filling layer 203 in such a way that the first and second partial layers 21, 22 are uncovered only in the region of the first side 101 of the semiconductor body 100. Afterward, a mask layer 204 having a cutout 205 above the second partial layer 22 is applied to the first side 101. The filling material 203 and the mask layer 204 together form a mask which is subsequently used to remove the second partial layer 22 from the semiconductor body 100. This removal of the second partial layer 22 is effected, for example, using an etching method that etches the second partial layer 22 selectively with respect to the material of the semiconductor body 100 and the filling material 203. The mask layer 204 protects the first partial layer 121 during these methods. After the second partial layer 22 has been removed, the filling material 203 and the mask layer 204 are removed. The result of these method processes explained with reference to FIG. 8 is a semiconductor structure in accordance with FIG. 1B in which a foreign material layer 21 is arranged only on the first sidewall 11 of the trench 10. In this method, too, in a manner not illustrated in more specific detail, the mask layer (201 in FIG. 1) for the etching of the trench 10 can still be present on the front side 101.

Figure 9:
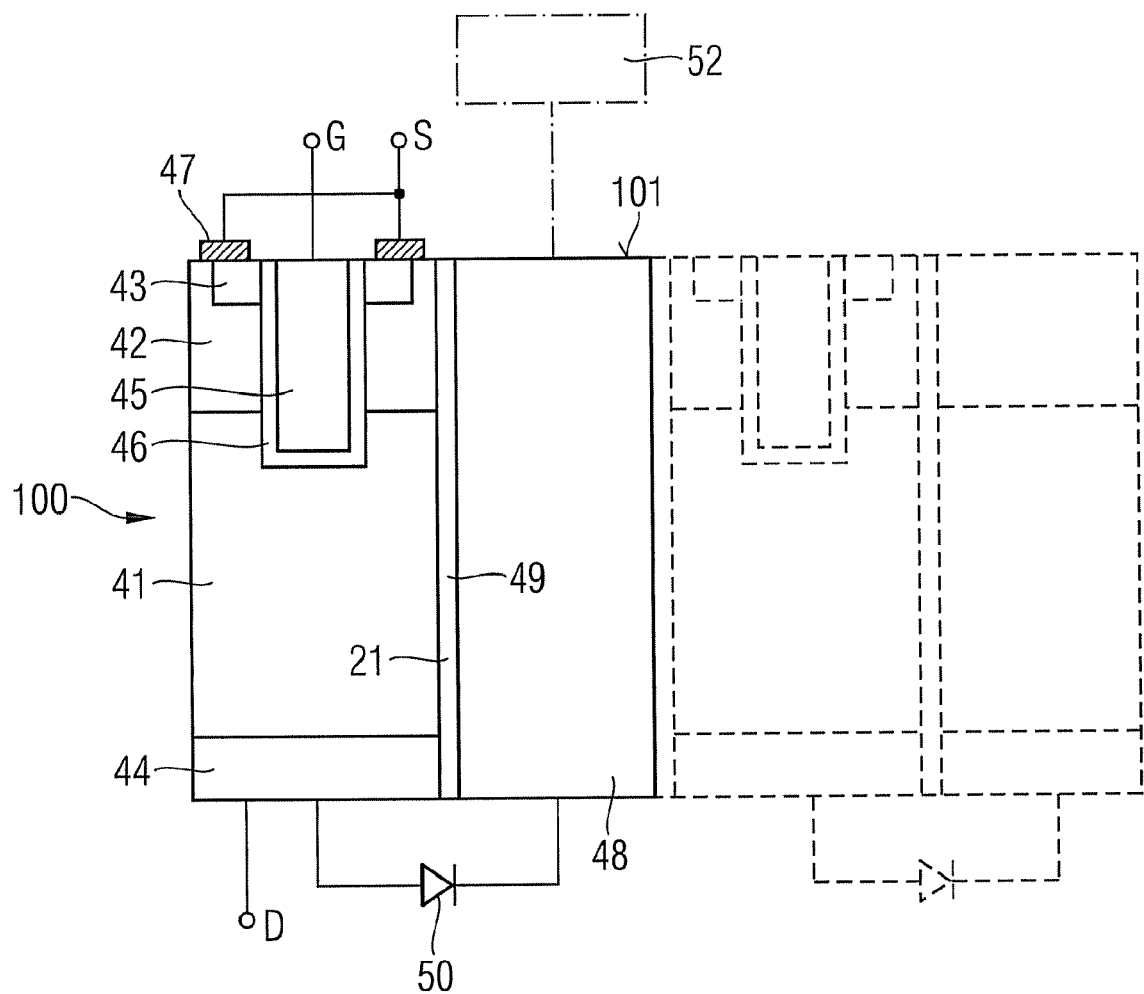
FIG. 9 illustrates a basic structure of a semiconductor component including a drift zone, a drift control zone arranged adjacent to the drift zone, and a drift control zone dielectric.

The above-explained method for producing a foreign material layer extending in a vertical direction of a semiconductor body is suitable, for example, for producing a drift control zone dielectric of a vertical power semiconductor component such as is illustrated in FIG. 9. However, it goes without saying that the method explained is not restricted to being used for producing such a drift control zone dielectric.

FIG. 9 illustrates an excerpt from a vertical cross section through a semiconductor body 100 in which component regions of a vertical power semiconductor component are integrated. This component has a MOS transistor structure having a drift zone 41, a source zone 43 and also a body zone 42 arranged between the drift zone 41 and the source zone 43. A drain zone 44 is adjacent to the drift zone 41 at a side of the drift zone 41 which is remote from the body zone 42. A gate electrode 45 is present for controlling a conducting channel in the body zone 42 between the source zone 43 and the drift zone 41, the gate electrode being dielectrically insulated from the source zone 43, the body zone 42 and the drift zone 41 by a gate dielectric 46. In the example illustrated, the gate electrode 45 is realized as a trench electrode. In this case, the gate electrode extends into the semiconductor body 100 in a vertical direction proceeding from the front side 101 and in this case extends adjacent to the source zone 43 and the body zone 42 right into the drift zone 41.

Contact is made with the drain zone 44 by a drain terminal D, with the source zone 43 by a source terminal S and with the gate electrode 45 by a gate terminal G. These terminals are only illustrated schematically in FIG. 9. The source zone 43 and the body zone 42 can be short-circuited with one another by a source electrode 47, with which contact is made by the source terminal S, in a manner that is known in principle.

The MOS structure illustrated functions in a manner that is known in principle, that is to say that the component is turned on when a suitable drive potential is applied to the gate electrode 45, the potential being chosen such that a conducting channel is formed along the gate electrode 45 between the source zone 43 and the drift zone 41. The component is correspondingly turned off if a potential suitable for forming a conducting channel in the body zone 42 is not present at the gate electrode 45. In the case of a structure of an n-conducting normally off MOS transistor, the drift zone 41 and the source zone 43 are n-doped, while the body zone 42 is p-doped. The drive potential of the gate electrode 45 at which the component is turned on is in this case an electrical potential which is positive with respect to source potential and which lies above the source potential by the value of a threshold voltage of the MOS structure. In the case of a p-conducting normally off MOS transistor, the drift zone 41 and the source zone 43 are p-doped, while the body zone 42 is n-doped. The drive potential of the gate electrode 45 at which the component is turned on is in this case an electrical potential which is negative with respect to source potential 43.

In the case of the component structure illustrated, the drift control zone 48 serves for forming, when the component is driven in the on state, an electrically conducting channel in the drift zone 41 along a drift control zone dielectric 49 arranged between the drift zone 41 and the drift control zone 48. In a component in which the drift zone 41 is doped by the same conduction type as the source zone 43 and the drain zone 44, the channel is an accumulation channel. It should also be pointed out in this connection that the drift zone 41 can also be doped complementarily to the source zone 43 and the drain zone 44. In this case, the conducting channel is an inversion channel. A charging circuit 52 is connected to the drift control zone 48, which, like the drift zone 41, is composed of a monocrystalline semiconductor material. The charging circuit 52 is designed to charge the drift control zone 48, when the component is driven in the on state, to a suitable electrical potential that is suitable for forming the conducting channel along the drift control zone dielectric 21. In the case of an n-conducting component, this electric potential of the drift control zone 48 is an electrical potential which is positive with respect to the electrical potential of the drift zone 41.

The drift control zone 48 is connected to the drain zone 44 via a rectifier element 50. In this case, the rectifier element 50 is connected with a polarity such that, when the component is turned off, the rectifier element puts the drift control zone 48 approximately at the electrical potential of the drain zone 44 in order in this way, in principle, to enable the propagation of a space charge zone in the drift control zone 48. When the component is driven in the on state, the rectifier element 50 prevents the drift control zone 48 from being discharged in a direction of the drain zone 44.

The component structure illustrated in FIG. 9 is known in principle, such that further explanations in this respect can be dispensed with. It should also be noted in this connection that FIG. 9 only serves for illustrating the basic principle of such a component, and that diverse variations are conceivable with regard to the precise component geometry, in one embodiment with regard to the type of gate electrode (trench electrode or planar electrode). What is common to vertical power components of the component type illustrated in FIG. 9 is that a drift control zone dielectric 49 extending in a vertical direction in the semiconductor body 100 is present. The width of the drift control zone dielectric 21 lies, for example, in the range of between 10 nm and 200 nm, in one embodiment between 30 nm and 100 nm. The depth of the drift control zone dielectric 21 is crucially determined by the dimensions of the drift zone 41 in a vertical direction. The dimensions of the drift zone 41 are dependent on the desired dielectric strength of the component. In components having a dielectric strength of up to 600V, the dimension of the drift zone 41 in a vertical direction is 55 µm, for example. An aspect ratio of such a drift control zone dielectric 21 is then between 1:550 and 3:5500, for example.

A drift control zone dielectric 49 having such an aspect ratio can be produced without any problems by using the method explained above with reference to FIGS. 1 to 7. In this case, the foreign material layer 21 that is to be produced for this application purpose in the semiconductor body 100 is composed of a dielectric material. For producing a drift control zone dielectric 49 of such a vertical power semiconductor component it is possible to implement various modifications of the method for producing a foreign material layer that has been explained in principle hitherto. Examples of such modifications will be explained below.

FIGS. 10A to 10E illustrate a method for producing a foreign material layer which is tailored to the production of a drift control zone dielectric for a component in accordance with FIG. 9. In this case, the foreign material layer 21 forms the drift control zone dielectric 49 of the later power component. In the method explained with reference to FIG. 10, the semiconductor body 100 has at least four semiconductor layers 110, 111, 113, 114 arranged successively. In this case, a further semiconductor layer 112 can optionally be arranged between a second layer 111 and a third layer 113 from among the semiconductor layers. The reference symbol 110 in FIG. 10A designates a bottommost semiconductor layer of the layer stack proceeding from the first side 101. The reference symbol 114 designates a fourth semiconductor layer, which forms the first side 101 of the semiconductor body 100. The second and third semiconductor layers 111, 113 and also the optional further semiconductor layer 112 serve, in a manner still to be explained, for realizing a rectifier element (50 in FIG. 9) connected between the drain zone and the drift control zone of the later component.

In the method explained with reference to FIG. 10, the trench 10 is produced in such a way that it extends, proceeding from the first side 101, through the fourth 114, the third 113, the optional further 112 and the second 111 semiconductor layer right into the first semiconductor layer 110. In accordance with the explanations regarding FIG. 1A, the trench can have vertical sidewalls (as illustrated) or oblique sidewalls (not illustrated).

Figure 10A:
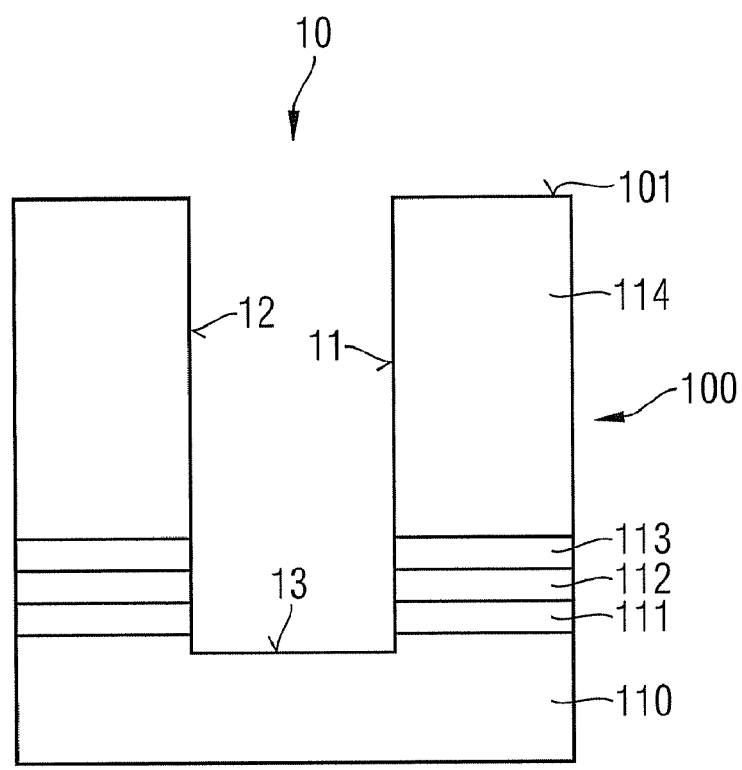
FIGS. 10A-10E illustrate one embodiment of a method for producing a drift control zone dielectric for a component in accordance with FIG. 9.
Figure 10B:
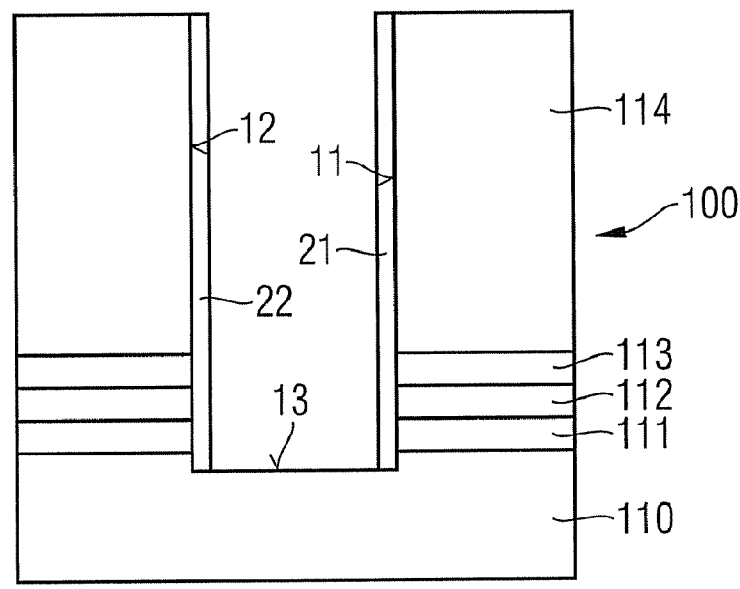

FIG. 10B illustrates a vertical cross section through the semiconductor body 100 after further method processes have been carried out, in which first and second partial layers 21, 22 of the foreign material layer were produced on opposite sidewalls 11, 12 of the trench. The method processes explained with reference to FIGS. 7A and 7B are suitable, for example, for producing the partial layers.

Figure 10C:
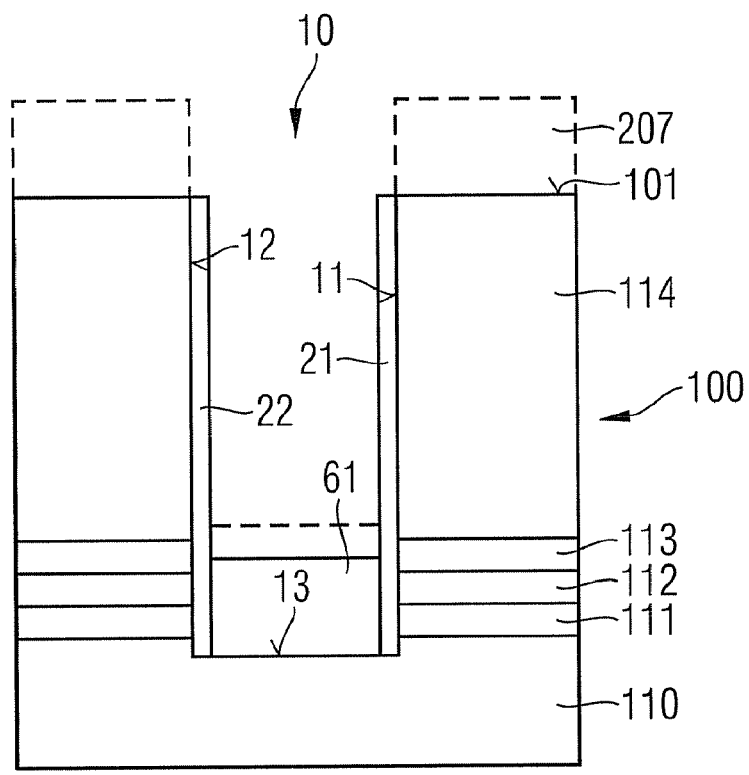

Referring to FIG. 10C, a semiconductor layer 61 is subsequently applied to the bottom 13 of the trench 10, which semiconductor layer extends in a vertical direction at least as far as the level of the third semiconductor layer 113, but can also extend as far as the level of the fourth semiconductor layer 114, which is illustrated in a dashed manner in FIG. 10C. The semiconductor layer 61 is composed of a semiconductor material of the same conduction type as the first semiconductor layer 110 and can be produced, for example, by using a selective epitaxy method. The first semiconductor layer 110 serves as a drain zone (44 in FIG. 9) in the finished component, in a manner still to be explained. The semiconductor layer 61 forms a connecting zone and serves for connecting the drain zone to the later drift zone of the component, as will be explained below.

The connecting zone 61 is produced on the bottom 13 of the trench 10, for example, by using an epitaxy method, such as, for example, a selective epitaxy method. In this case, the first and second partial layers 21, 22 protect the sidewalls 11, 12 of the trench 10 against the application of the semiconductor material of the connecting zone 61. Moreover, in this method, a protective layer 207 can be applied to the front side 101 of the semiconductor body 100.

Figure 10D:
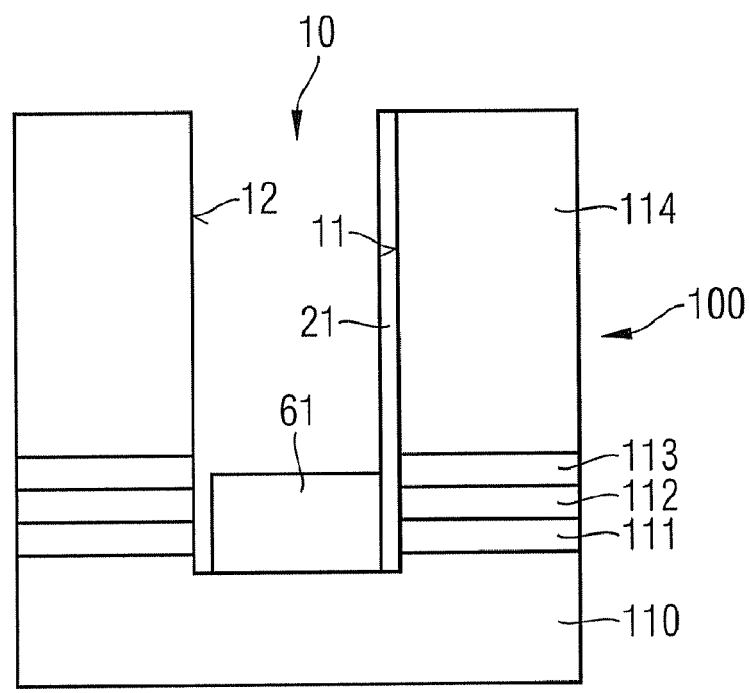

Referring to FIG. 10D, the second partial layer 22 is subsequently removed from the second sidewall 12 of the trench. By way of example, the method explained with reference to FIG. 7C or the method explained with reference to FIG. 8 is suitable for this purpose. After the second partial layer 22 has been removed, initially a narrow trench remains between the connecting zone 61 and the semiconductor body 100 in the region of the second wall 12 of the trench 10.

Figure 10E:
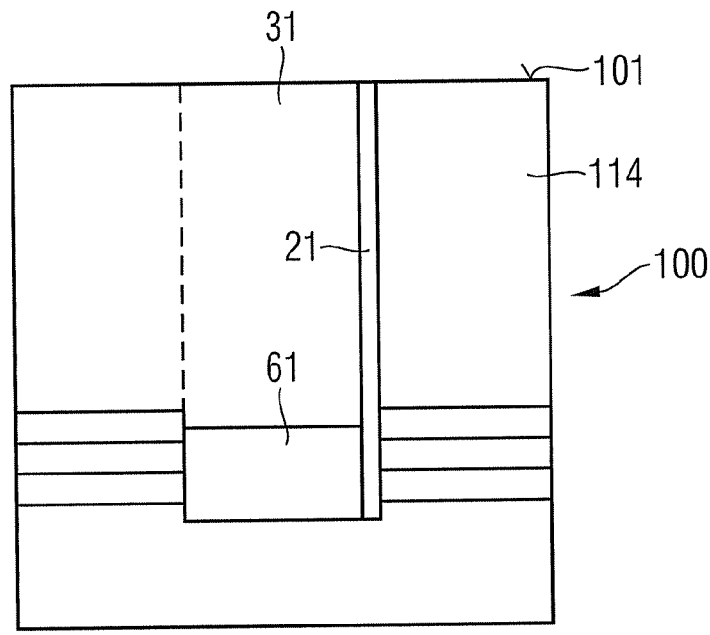

The trench 10 is subsequently filled by epitaxial deposition of a semiconductor layer—and, if appropriate, etched back or ground back in the region of the first side—the result of which is illustrated in FIG. 10E. The material of the deposited semiconductor layer, which material is designated by the reference symbol 31 in FIG. 10E, forms part of the later drift zone of the component in a manner still to be explained. The drift zone is lightly doped in comparison with the drain zone of the component and is therefore also lightly doped in comparison with the connecting zone 61 that connects the later drift zone to the drain zone. The doping concentration of the drift zone lies, for example, in the region of $10^{14}$ cm$^{-3}$, while the doping concentration of the drain zone lies, for example, in the region of $10^{18}$ cm$^{-3}$ or higher. When the trench 10 is filled by epitaxial deposition of the semiconductor layer, the narrow trench between the second sidewall 12 and the connecting zone 61 is also filled. In addition, during the production method, dopant atoms of the more highly doped connecting zone 61 indiffuse into the deposited semiconductor layer to an extent such that the highly doped connecting zone 61, after the trench has been filled, extends in a lateral direction as far as the second and third 111, 113 and the optional further semiconductor layer 112.

When the narrow trench between the connecting zone 61 and the second sidewall 12 of the trench 10 is filled, cavities (voids) can possibly be formed. However, voids in this region of the semiconductor body do not have any adverse effects on the function of the component.

In the method explained with reference to FIG. 10, the doping concentration of the epitaxially deposited semiconductor layer corresponds in one embodiment to the doping concentration of the fourth semiconductor layer 114. Regions of this fourth semiconductor layer 114 and regions of the epitaxially deposited semiconductor layer 31 form sections of the drift zone of the component in a manner still to be explained.

Figure 11:
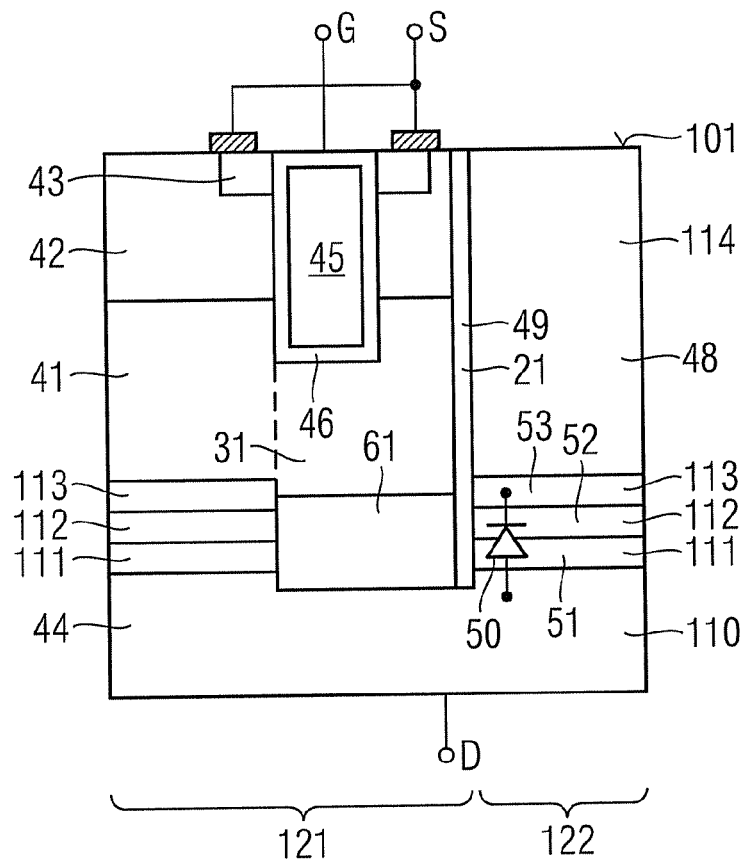
FIG. 11 illustrates a first example of a component which is obtained after carrying out further method processes following the method processes in accordance with FIG. 10.

FIG. 11 illustrates an excerpt from the completed vertical power component. The component in accordance with FIG. 11 is obtained, proceeding from the component structure illustrated in FIG. 10E, by producing the body zone 42, the source zone 43 and also the gate electrode 45 and the gate dielectric 46, which insulates the gate electrode from the semiconductor body. In principle, known diffusion and/or implantation methods are suitable, for example, for producing the body zone 42 and the source zone 43. In order to produce the gate electrode 45, for example, a trench is produced, on the sidewalls and bottom of which the gate dielectric 46 is applied and which is subsequently filled with a filling material that forms the gate electrode 45.

The drain zone 44 of the component illustrated in FIG. 11 is formed by the first semiconductor layer 110. This semiconductor layer 110 is a highly doped semiconductor substrate, for example, onto which the remaining semiconductor layers that were explained comprehensively with reference to FIG. 10A, for example, were deposited successively as epitaxial semiconductor layers. In this component, the foreign material layer 21 forms the drift control zone dielectric 49 and extends right into the first semiconductor layer 110. The drift control zone dielectric 49 can be a homogenous layer composed of only one dielectric material, but can also have, in a manner not illustrated in more specific detail, a sandwich like structure having a plurality of layers composed of dielectric materials. Apart from the drift control zone dielectric 49 being composed of a dielectric material, all the explanations given above for the foreign material layer 21 are correspondingly applicable to the drift control zone dielectric.

The drift control zone dielectric 21 subdivides the second to fourth semiconductor layers 111, 113, 114 and the optionally present further semiconductor layer 112 into two sections: a first section 121, which is arranged to the left of the drift control zone dielectric 49 in the example in accordance with FIG. 11 and in which the connecting layer 61 and the epitaxial layer 31 were produced; and a second section 122, which is situated to the right of the drift control zone dielectric 49 in the example in accordance with FIG. 11.

In the component in accordance with FIG. 11, the MOS transistor structure is formed in the first section 121, while the drift control zone 48 is formed in the second section 122. In the first section 121, those regions of the fourth semiconductor layer 114 and of the epitaxial layer 31 which were not redoped during the production of the body zone 42 and the source zone 43 form the drift zone 41. In the second section 122, the second and third semiconductor layers 111, 113 form anode and cathode zones of a bipolar diode. The optionally present further semiconductor layer 112 forms a base zone of the bipolar diode. In the case of an n-conducting MOS transistor, in which the drain zone 44 is n-doped and in which the drift control zone 48 is at a higher electrical potential than the drift zone 41 when the component is turned on, the bipolar diode is realized in such a way that the second semiconductor zone 51 forms an anode zone 51 and the third semiconductor zone 113 forms a cathode zone 53. In this case, the second semiconductor zone 111 is p-doped, while the third semiconductor zone 113 is n-doped. In this case, the optionally present further semiconductor zone 112 can be weakly n-doped, weakly p-doped or intrinsic. In this connection, "weakly doped" means that the further semiconductor layer 112 is doped more weakly than the second and third semiconductor layers 111, 113. In order to afford a better understanding, the electrical circuit symbol of such a bipolar diode is likewise depicted in FIG. 11. This bipolar diode forms a rectifier element 50 in accordance with FIG. 9.

In the second section 122, the fourth semiconductor layer 114 forms the drift control zone 48 of the component. A charging circuit connected to this drift control zone and a connection zone possibly present for connecting the charging circuit to the drift control zone 48, where these can also be doped complementarily to the drift control zone 48, are not illustrated in FIG. 11 for reasons of clarity.

The layer stack having the second and third 111, 113 and the optionally present further semiconductor layer 112 has no electrical function in the first section 121. This layer stack is "bridged" by the connecting zone 61, which directly connects the drain zone 44 to the drift zone 41 and which, in the example illustrated, also connects the drain zone 44 to the drift zone 41 via the highly doped third semiconductor layer 113.

As is illustrated schematically in FIG. 9, the vertical power component can have a plurality of transistor cells of identical type, each having a drift zone, a drift control zone, a body zone, a source zone, a drain zone and a gate electrode. In this case, the individual transistor cells are connected in parallel by the drain zones of the individual transistor cells being connected to one another, by the source and body zones of the individual transistor cells being electrically conductively connected to one another, and by the gate electrodes of the individual transistor cells being electrically conductively connected to one another. In order to produce such a power component having a plurality of transistor cells of identical type, the method processes for producing a drift control zone dielectric 49 and the further component zones as explained above with reference to FIGS. 9 and 10 are carried out simultaneously at a plurality of locations of the semiconductor body.

Figure 12:
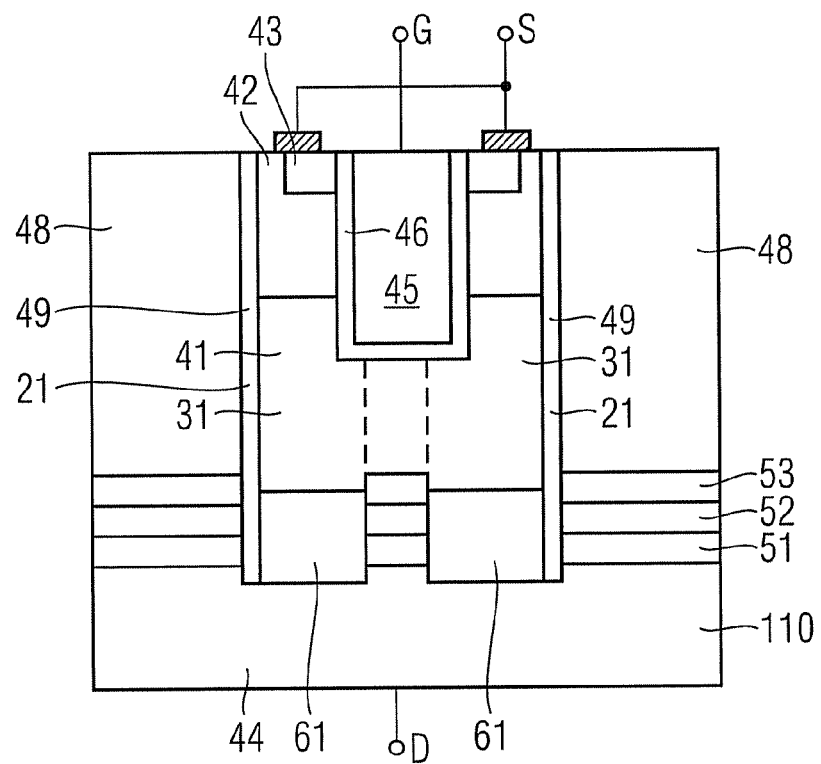
FIG. 12 illustrates one embodiment of a component which is obtained after carrying out further method processes following the method processes in accordance with FIG. 10.

FIG. 12 illustrates an excerpt from a vertical cross section of a power semiconductor component in which two drift control zone dielectrics 49 were produced at a distance from one another in the semiconductor body. These drift control zone dielectrics 49 are produced in this case in such a way that the connecting zones 61 and the epitaxial layers 31 are adjacent to those sides of the drift control zone dielectrics 49 which are opposite one another. The MOS transistor structure having the body zone 42, the source zone 43 and the gate electrode 46 is realized in this region with the connecting zones 61 and the epitaxial layers 31. The drift control zone dielectrics 49 or foreign material layers 21 explained with reference to FIG. 12 can be produced in such a way that two trenches are produced at a distance from one another in the first lateral direction y, and that the method processes explained with reference to FIG. 1 are subsequently carried out.

The structure in accordance with FIG. 12 can also be obtained by producing a ring-shaped trench, as was explained with reference to FIG. 6. In the later component, the MOS transistor structure is arranged in the "inner region" of the original trench. The drift control zone 48 is situated in the "outer region" of the trench.

Figure 13A:
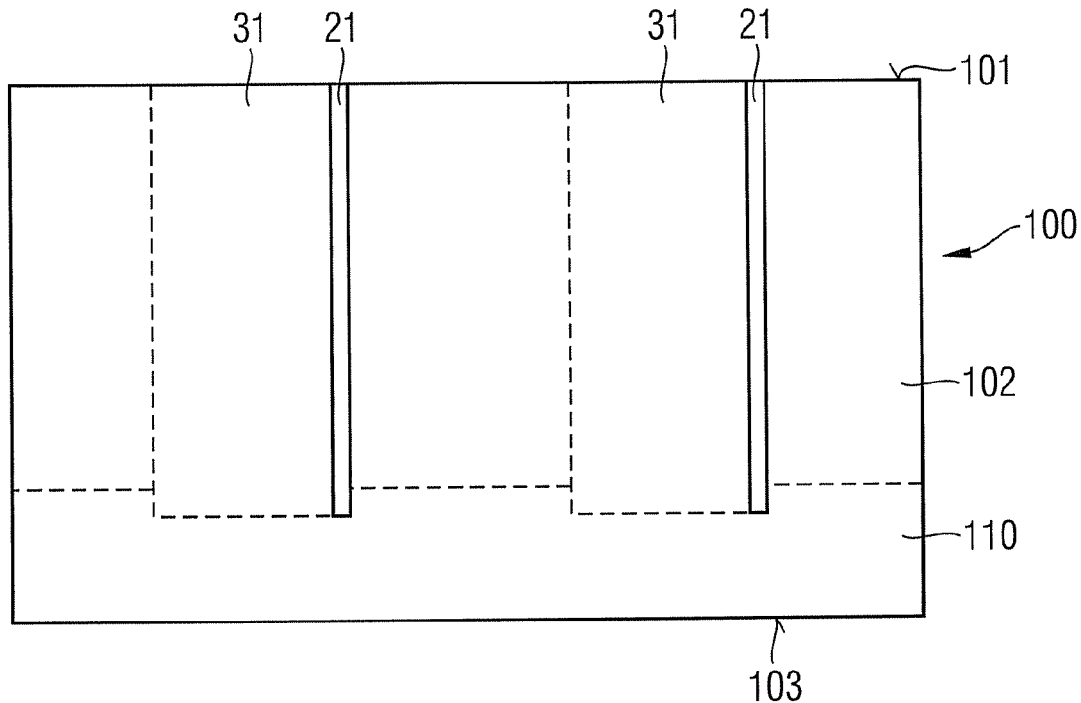
FIGS. 13A-13C illustrate one embodiment of a method for producing a drift control zone dielectric for a component in accordance with FIG. 9.
Figure 13B:
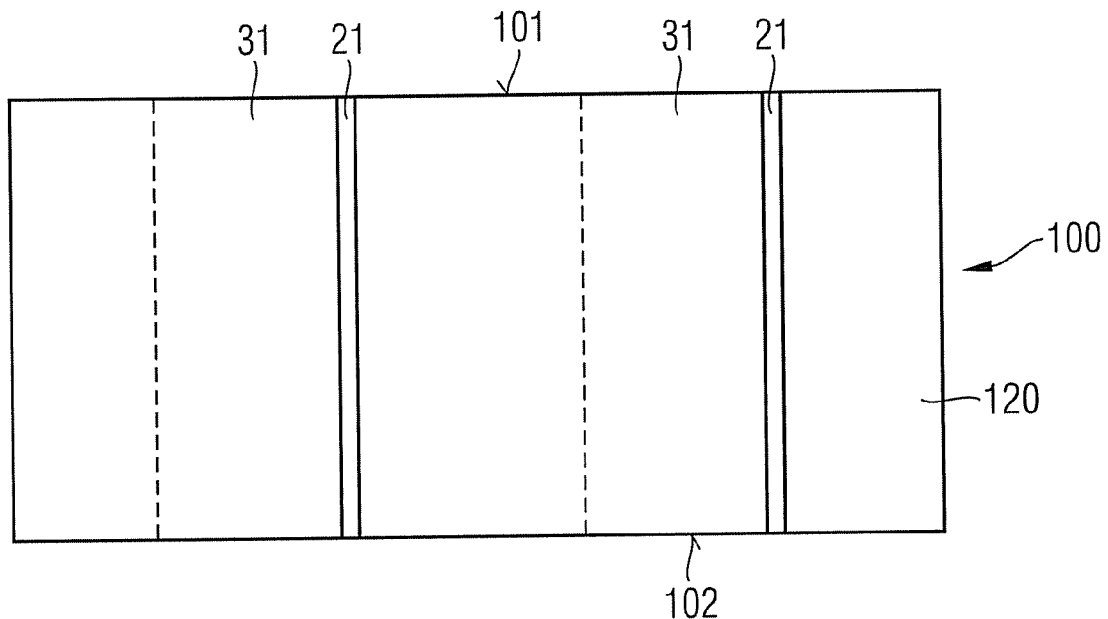
Figure 13C:
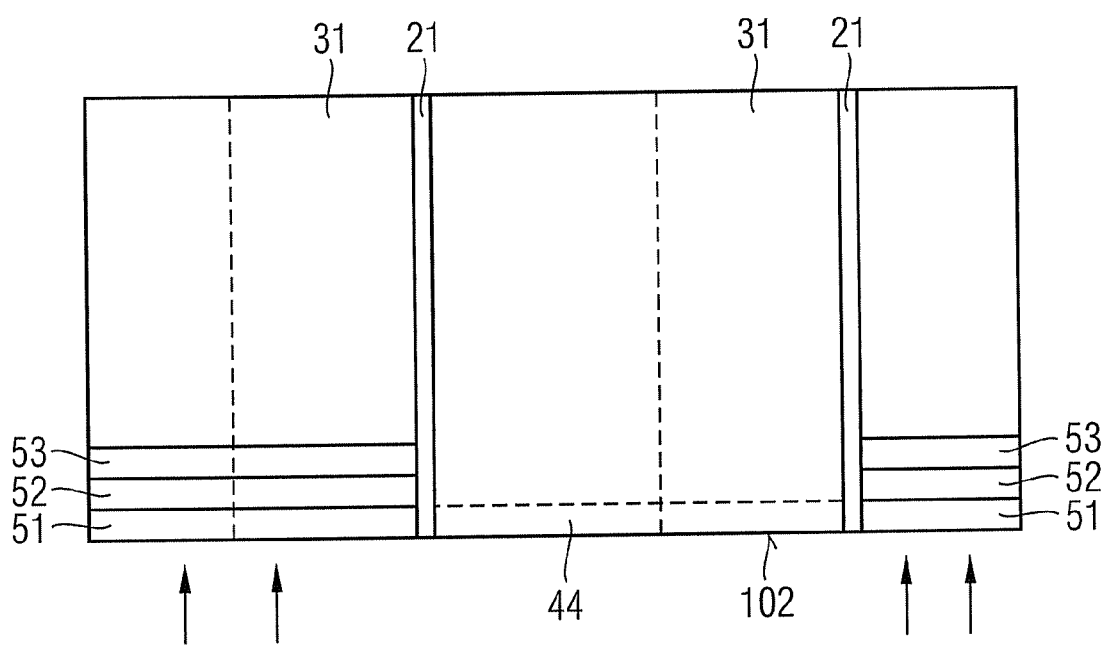

A further method for producing a drift control zone dielectric for a component in accordance with FIG. 11 is explained below with reference to FIGS. 13A to 13C. FIG. 13A illustrates a vertical cross section through the semiconductor body 100 after producing a plurality of dielectric foreign material layers 21 arranged at a distance from one another in a lateral direction. The foreign material layers 21 extend into the semiconductor body 100 in a vertical direction proceeding from the first side 101, but in this case do not reach as far as a second side 103—opposite the first side—of the semiconductor body 100. Referring to FIG. 13B, the semiconductor body 100 is subsequently removed proceeding from the second side 103 until the foreign material layers 21 are uncovered in sections in the region of the second side 102. Such removal is effected, for example, by using an etching method or a grinding or polishing method. After the conclusion of these method processes, the semiconductor body 100 has a plurality of semiconductor sections which are in each case separated from one another by a foreign material layer 21. For producing a vertical power component in accordance with FIG. 9, including a plurality of transistor cells each having a drift zone and a drift control zone, MOS transistor structures having body and source zones and also a gate electrode and drift control zones are produced alternately in every second one of the semiconductor sections. The method explained with reference to FIG. 13 provides for integrating the rectifier elements 50 explained with reference to FIG. 9 as integrated bipolar diodes in the semiconductor regions in which the drift control zones 48 are arranged. Referring to FIG. 13C, in order to realize the bipolar diodes, provision is made for producing two semiconductor zones 51, 53 doped complementarily to one another in every second one of the abovementioned semiconductor sections, the semiconductor zones being arranged successively proceeding from the second side 102.

The semiconductor zones 51, 53 are produced, for example, by implanting suitable dopant atoms into the semiconductor body 100 via the second side 102. In this case, the semiconductor zones 51, 53 can be produced in such a way that a first one of the semiconductor zones 51 is directly adjacent to the second side 102, and that the second one of the semiconductor zones 53 is either directly adjacent to the first semiconductor zone 51 or arranged at a distance from the first semiconductor zone 51 (as illustrated). For producing an n-conducting component, the first semiconductor zone 51 is p-doped and the second semiconductor zone 53 is n-doped. A further semiconductor zone 52 can be arranged between the first and second semiconductor zones 51, 53, the further semiconductor zone forming a base zone of the bipolar diode. The base zone can be weakly p-doped, weakly n-doped or intrinsic. A doping concentration of the base zone 52 can correspond in one embodiment to a basic doping of the semiconductor body 100 or the epitaxial layer 31.

The implantation of the dopant atoms for producing the component zones of the bipolar diode is effected, in a manner not illustrated in more specific detail, in masked fashion in such a way that no dopant atoms are implanted into the semiconductor regions in which MOS transistor structures are produced. As an alternative, dopant atoms can also be implanted into the semiconductor regions in which MOS transistor cells are produced, as long as it is ensured that only atoms of the conduction type of the source zone 43 are implanted into these regions. Optionally, dopant atoms of the same conduction type as the later source zone of the component can additionally be implanted into the regions in which MOS transistor structures are produced, in a dedicated process step, via the second side 102. The dopant atoms form in this region a drain zone 44 or at least one contact layer for the low-resistance connection of a drain electrode to the later drift zone of the component.

In this case, methods for annealing the doping are particularly suitable in which the later chip front side remains so cool that a metallization applied there and a passivation (not illustrated) are not damaged, which is possible e.g., by using the rear side being momentarily heated by laser pulses. An n-type doping can also be formed by hydrogen-induced donors. In order to form such hydrogen-induced donors, activation temperatures in the temperature range of between 350° C. and 500° C. are already sufficient after the implantation of hydrogen.

Figure 14:
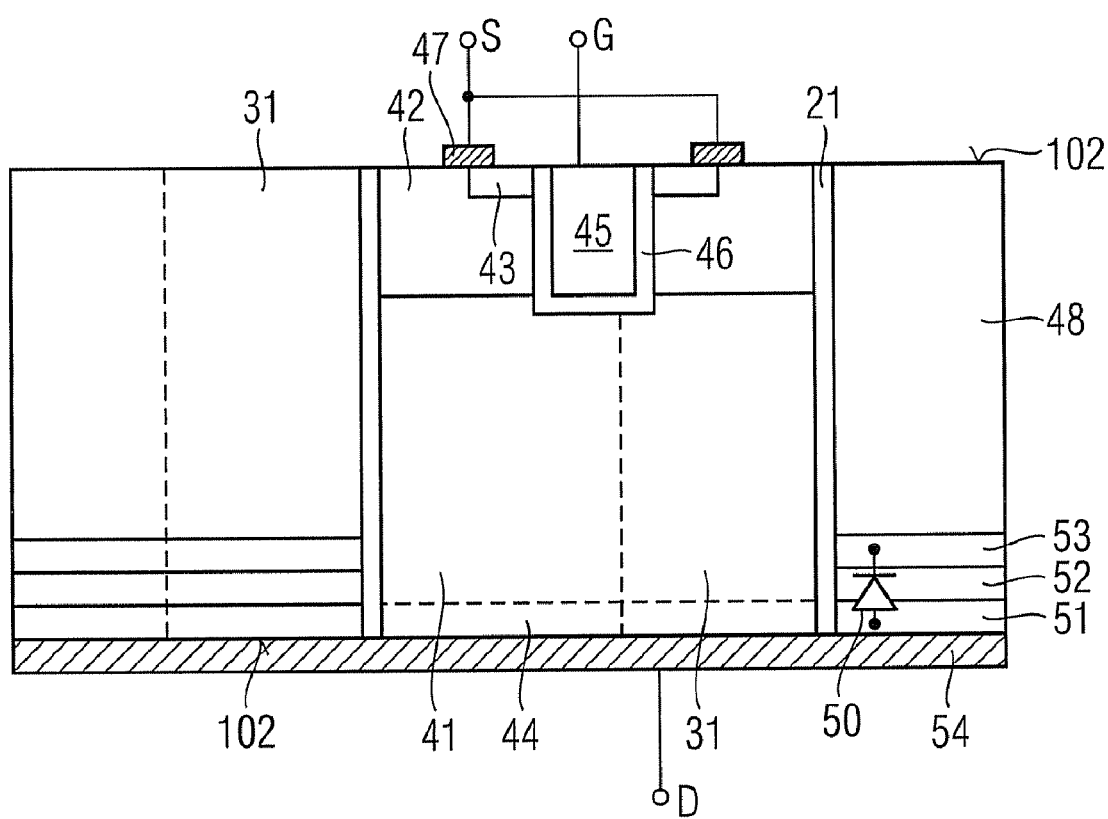
FIG. 14 illustrates one embodiment of a component which is obtained after carrying out further method processes following the method processes in accordance with FIG. 13.

FIG. 14 illustrates a vertical cross section through the finished component. In this component, the drain zone 44 and the bipolar diode, which form the rectifier element 50, are connected to one another by a drain electrode 54 applied to the rear side 102 of the semiconductor body over the whole area. The body zone 42, the source zone 43 and also the gate electrode 45 with the gate dielectric 46 can be produced in accordance with the explanations regarding the component in accordance with FIG. 12.

In the component illustrated in FIG. 14, the drift zone 41 and the drift control zone 48 are formed by those regions of the semiconductor body 100 which have a basic doping, that is to say which were not redoped by the production of further component zones, or by those regions of the epitaxial layer 31 which have a basic doping of the epitaxial layer. In this component, the epitaxial layer 31 is produced in one embodiment in such a way that its doping corresponds to the basic doping of the semiconductor body 100.

It should be noted in this connection that the semiconductor body in the method in accordance with FIG. 13, prior to removal proceeding from the rear side 102, can have two differently doped semiconductor layers 110, 120, as is illustrated in FIG. 13A. In this case, the first semiconductor layer 110 is a semiconductor substrate, for example, which can have any desired doping if it is completely removed in the further production sequence, as will be explained below. The second semiconductor layer 120 is an epitaxial layer, for example, whose doping is chosen such that this doping corresponds to the doping of the later drift zone of the component. In this component, removal of the semiconductor body 100 proceeding from the second side 103 is effected in such a way that the first semiconductor layer 110 is completely removed in the process, with the result that, after removal, the semiconductor body 100 only has regions of the second semiconductor layer 120 or of the epitaxial layer produced in the trenches.

In the method explained with reference to FIGS. 13A-13C, it is also possible, of course, to use a ring-shaped trench, as explained with reference to FIG. 6, or a trench having any other geometry.

A further method for producing a foreign material layer extending in a vertical direction in a semiconductor body is explained below with reference to FIGS. 15A to 15E. These figures each illustrate a vertical cross section through the semiconductor body 100.

Figure 15A:
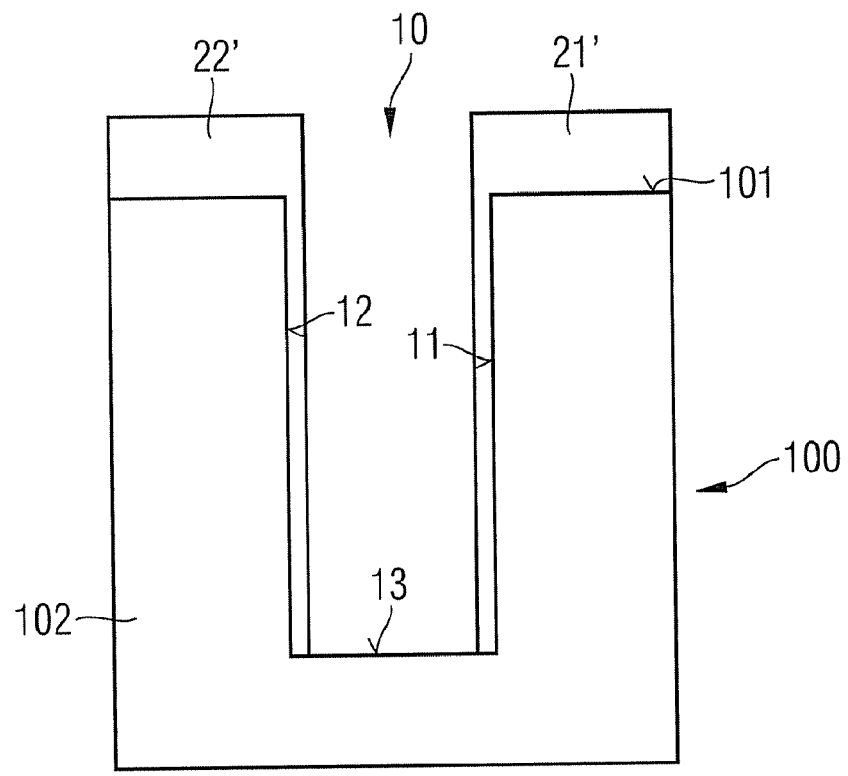
FIGS. 15A-15E illustrate one embodiment of a method for producing a material layer on only one sidewall of a trench of a semiconductor body.

FIG. 15A illustrates the semiconductor body 100 after carrying out first method processes involving the production of a trench 10 in the semiconductor body 100, the trench extending in a vertical direction of the semiconductor body 100 proceeding from the front side 101. After this trench 10 has been produced, foreign material layers 21', 22' are produced, which cover the sidewalls 11, 12 of the trench 10 and the front side 101 of the semiconductor body 100, but do not cover the trench bottom 13—apart from in the region of the sidewalls 11, 12. A foreign material layer 21' which covers the first sidewall 11 and the front side 101 in a region adjacent to the first sidewall 11 is referred to hereinafter as first foreign material layer 21', and a foreign material layer 22' which covers the second sidewall 12 and the front side 101 in a region adjacent to the second sidewall 12 is referred to hereinafter as second foreign material layer 22'. The two foreign material layers 21', 22' are composed of a material which differs from the material of the semiconductor body 100 in a manner already explained. These foreign material layers 21', 22' are, for example, dielectric layers, such as e.g., layers composed of an oxide of the semiconductor material of the semiconductor body 100. When silicon is used as semiconductor material for the semiconductor body 100, the foreign material layers 21', 22' are then, for example, layers composed of silicon oxide ($SiO_2$).

The foreign material layers 21', 22' applied on the opposite sidewalls 11, 12 and the front side 101 are produced, for example, by a trench 10 firstly being etched using a patterned hard mask, which can be e.g., silicon oxide. The patterning of the hard mask itself can be effected photolithographically with subsequent dry-chemical etching or by using a photolithographically patterned additional layer, such as polysilicon, for example, which then serves, for its part, for the patterning of the oxide layer. After the etching of the trench 10, the mask layer is still present on the front side 101 of the semiconductor body 100; the structure obtained after the etching of the trench corresponds, for example, to the structure illustrated in FIG. 1A with the mask (201 in FIG. 1) applied on the front side. Afterwards, e.g., an oxide layer is deposited over the whole area or grown by using thermal oxidation, wherein an oxide layer arises at the trench bottom 13 and at the trench sidewalls 11, 12, which oxide layer is subsequently removed again from the trench bottom 13, for example, by using an anisotropic dry-chemical etching. The foreign material layers 21', 22' produced by such a method then include layer sections—namely the layer sections on the front side 101—which are composed of the originally produced etching mask (201 in FIG. 1) and further layer sections—namely the layer sections on the sidewalls 11, 12—which were produced by a deposition process or an oxidation process. These individual sections can be composed of the same material, such as e.g., an oxide. There is also the possibility of realizing the foreign material layers in such a way that they are composed of a different material on the sidewalls than on the front side 101.

It should also be noted that the trench 10 can have any desired geometry in accordance with the explanations regarding FIGS. 5 and 6. The trench can be, in one embodiment, an elongated trench as in FIG. 5 or a ring-shaped trench as in FIG. 6. Furthermore, a multiplicity of such trenches which are arranged at a distance from one another in a lateral direction of the semiconductor body can be arranged in the semiconductor body 100. FIGS. 15A to 15G only illustrate an excerpt from such a semiconductor body 100.

Figure 15B:
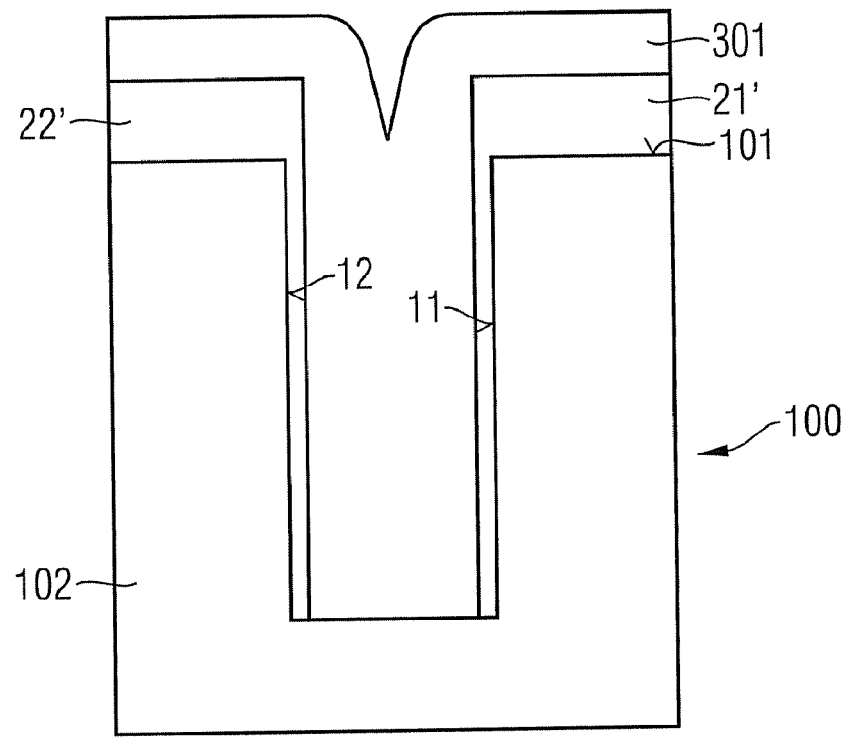

Referring to FIG. 15B, a protective layer 301 is subsequently applied to the semiconductor structure with the semiconductor body 100 and the trench 10 arranged therein, which protective layer covers the foreign material layers 21', 22' above the front side 101 and in the region of the trench sidewalls 11, 12 and additionally covers the trench bottom 13. The protective layer 301 can be produced with a layer thickness that is greater than 50% of the width of a trench that remains after the production of the foreign material layers 21', 22'. In this case—as illustrated in FIG. 15B—the trench 10 is completely filled with the protective layer 301. The thickness of the deposited protective layer can also be smaller than the aforementioned 50% of the width of the residual trench. In this case, a further residual trench (not illustrated) remains after the deposition of the protective layer. The protective layer 301 is composed, in one embodiment, of a material with respect to which the foreign material layers 21', 22' can be etched selectively. In this connection, "selective etching" should be understood to mean that the foreign material layers 21', 22' can be etched by an etchant that does not etch the protective layer 301 or etches it to a significantly smaller extent than the foreign material layers 21', 22'. The protective layer 301 is composed of carbon, for example, and can be deposited in a CVD process (CVD=Chemical Vapor Deposition) by pyrolysis of methane ($CH_4$). During the pyrolysis, the methane gives rise to a solid layer of carbon (C), which forms the protective layer 301, and volatile hydrogen ($H_2$). Foreign material layers 21', 22' composed of silicon oxide can be etched selectively with respect to such a protective layer 301 composed of carbon, for example, by using a solution containing hydrofluoric acid or containing ammonium fluoride.

Figure 15C:
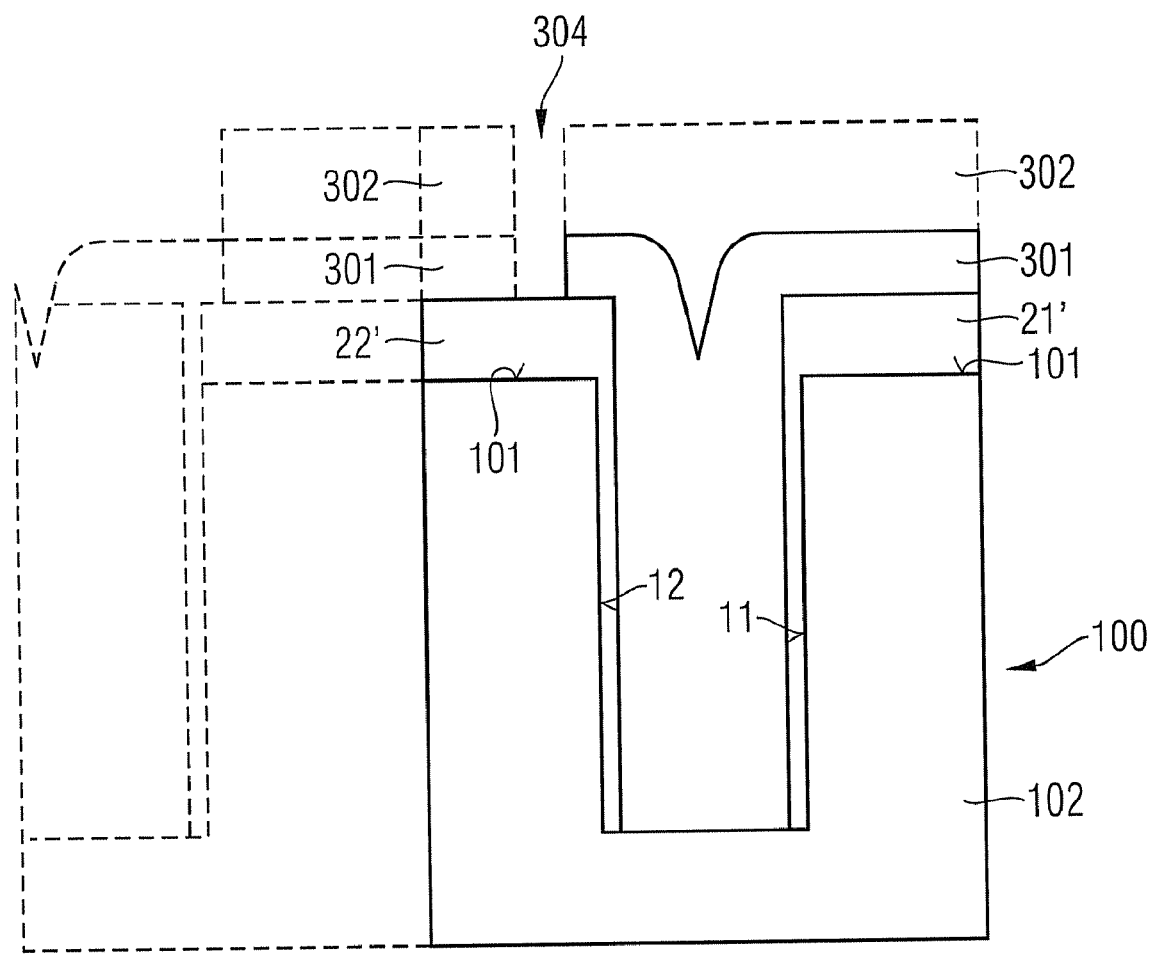

In next method processes, one of the foreign material layers—the second foreign material layer 22' in the example illustrated—is removed at least in the region of that sidewall of the trench 10 to which the foreign material layer is applied—the second sidewall 12 in the example illustrated. Referring to FIG. 15C, for this purpose, the protective layer 301 is patterned above the front side 101 of the semiconductor body 100 in such a way that the protective layer 301 has an opening 304 above that region of the front side 101 to which the second foreign material layer 22' is applied. The opening 304 can be locally restricted to a section in the region of a trench 10, as is illustrated in FIG. 15C. However, the opening 304 can also extend in a lateral direction of the semiconductor body 100 right into the region of a further trench on whose sidewall the second foreign material layer 22' is likewise applied and which is intended to be removed from there. Such a further trench with the second foreign material layer 22' applied thereto is illustrated in a dash-dotted manner in FIG. 15C.

The cutout 304 of the protective layer 301 can be arranged in a vertical direction above that section of the second foreign material layer 22' which is situated on the second sidewall 12 of the trench 10. In this case, the cutout 304 is situated as an extension of the second sidewall 12 in a vertical direction. As is illustrated in FIG. 15C, however, the cutout 304 can also be arranged offset with respect to the sidewall 12 of the semiconductor body 100 in a lateral direction of the semiconductor body 100.

The cutout 304 in the protective layer 301 is produced, for example, using a patterned mask 302 illustrated in a dashed manner in FIG. 15C. The mask 302 has a cutout in the region in which the cutout 304 of the protective layer 301 is intended to be produced, and thus enables the protective layer 301 to be etched selectively in the region in which the cutout is intended to be produced. The mask 302 is composed, for example, of an oxide, such as e.g., $SiO_2$, or a nitride, such as e.g., $Si_3N_4$, and can be produced, for example, by using a CVD or PECVD (Plasma Enhanced Chemical Vapor Deposition) process. When a carbon layer is used as the protective layer 301, the cutout 304 is produced, for example, by using an oxygen plasma process or by using a thermal process in an oxygen-containing or ozone-containing environment. By using these processes, the carbon layer is converted into carbon dioxide ($CO_2$) and thereby removed. The mask layer is not attacked by the processes and thereby protects the regions of the carbon layer 301 which are not intended to be removed. During these processes, an undercut of the mask layer 302 can occur in part, although this is not explicitly illustrated in the figures. One advantage of using a carbon layer as the protective layer 301 is that it can be removed on the basis of the processes explained without any residues and with high etching rates of 300 nm/min or more.

Figure 15D:
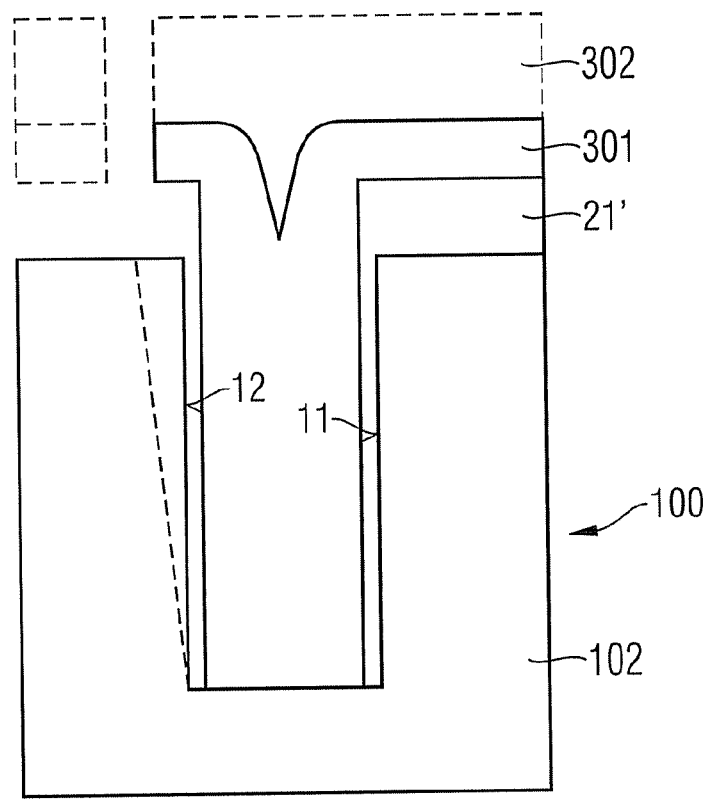

Referring to FIG. 15D, the foreign material layer 22' is subsequently removed at least from the second sidewall 12. For this purpose, via the cutout 304 produced in the protective layer 301, the foreign material layer 22' is subjected to an etching material which etches the second foreign material layer 22' selectively with respect to the protective layer 301 and the semiconductor body 100. When using silicon as material of the semiconductor body 100, a carbon layer as the protective layer 301 and a silicon oxide layer as the second foreign material layer 22', the etching material is, for example, a solution containing hydrofluoric acid or containing ammonium fluoride. If the cutout 304 of the protective layer 301 is situated offset with respect to the second sidewall 12 in a lateral direction of the semiconductor body 100, then the etching material firstly removes that section of the second foreign material layer 22' which is situated directly on the front side 101 before the etching material, between the semiconductor body 100 and the protective layer 301, removes that region of the second foreign material layer 22' which is situated on the second sidewall 12 of the trench. If the cutout 304 is situated directly above the second sidewall (not illustrated), then the etching material can directly act on that section of the second foreign material layer 22' which is situated on the second sidewall 12 of the trench.

The etching materials mentioned each have a high selectivity with respect to a carbon layer as protective layer 301 and a semiconductor body 100 composed of silicon, that is to say that they have a high etching rate with respect to the foreign material layer 22' and only a low etching rate with respect to the semiconductor body 100 and the protective layer 301. A ratio of the etching rate of the foreign material layer 22' to the etching rate of the semiconductor body 100 lies, for example, in the range of 500:1 to 10 000:1 or higher. One variant of the method explained provides for reducing the selectivity of the etching material with respect to the material of the semiconductor body 100 in a targeted manner. In the case of the abovementioned solutions containing hydrofluoric acid or containing ammonium fluoride, this can be done, for example, by adding nitric acid. The result of this reduction of the etching selectivity is that during the etching process the semiconductor body 100 is also etched in the region of the second sidewall 12, which leads as a result to a sidewall that is beveled with respect to the vertical, which is illustrated in a dashed manner in FIG. 15D. Such a beveled sidewall facilitates later filling of the trench with a semiconductor material by using an epitaxy process.

The mask layer 302 can be removed before the etching process is carried out. When a nitride layer is used as the mask layer 302, phosphoric acid, for example, is used for this purpose. Furthermore, there is also the possibility of removing the mask layer 302 during the etching process by which the second foreign material layer 22' is removed. This is the case e.g., when an oxide layer is used as the mask layer 302.

Figure 15E:
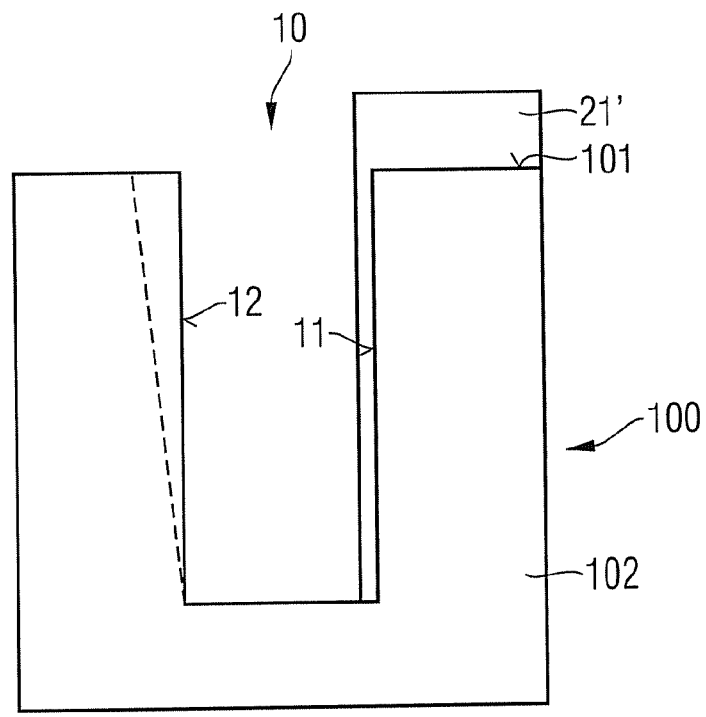

FIG. 15E illustrates the semiconductor structure after carrying out further method processes in which the protective layer 301 is removed. The result is a semiconductor structure including a semiconductor body 100, a trench 10 arranged in the semiconductor body 100, and a foreign material layer 21' arranged on one 11 of the sidewalls 11, 12 of the trench 10 and in sections in the region of the front side of the semiconductor body.

Figure 16A:
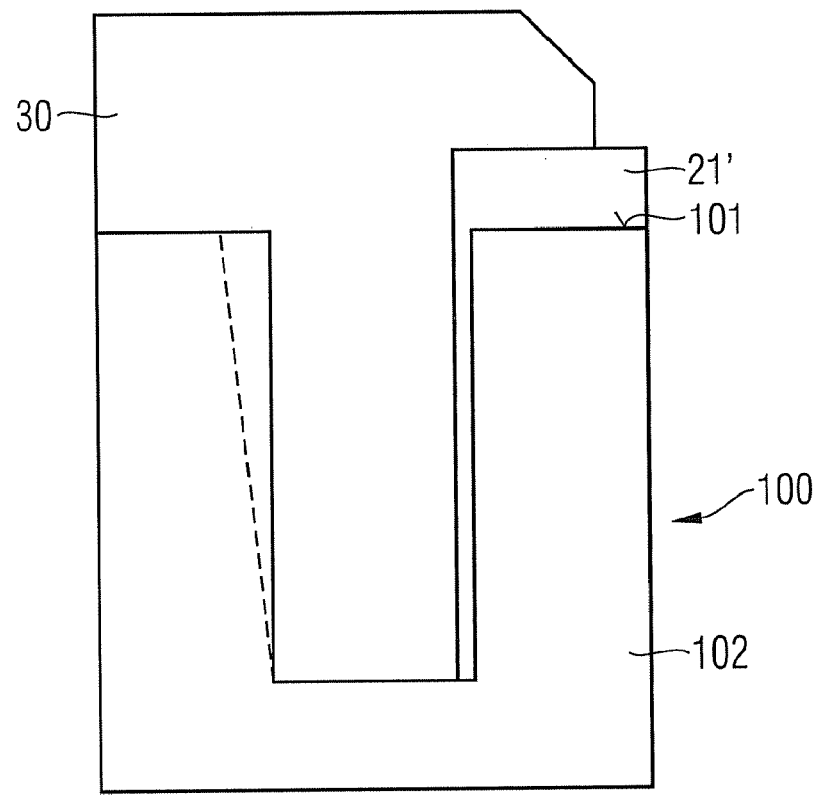
FIGS. 16A-16B illustrate one embodiment of method processes proceeding from a structure obtained by the method in accordance with FIG. 15.
Figure 16B:
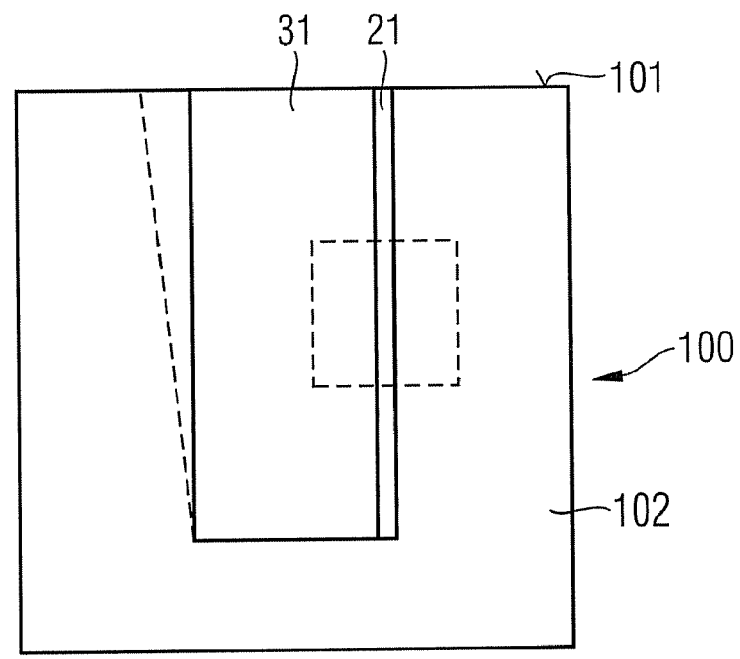

The trench 10 present again after the removal of the protective layer 201 can subsequently be filled with a semiconductor material. Referring to FIG. 16A, which illustrates the semiconductor body 101 in vertical cross section, for this purpose the trench 10 is filled epitaxially from the second trench sidewall 12. Referring to FIG. 16B, that section of the foreign material layer 21' which is present on the front side 101 and those sections of the epitaxial layer 30 which extend beyond the trench 10 can subsequently be removed. By way of example, an etching method or a polishing method, such as e.g., a CMP method, is suitable for this purpose. The result of these method processes is a semiconductor body 100 having a foreign material layer 21 arranged in the semiconductor body 100 and extending in a vertical direction of the semiconductor body 100. In accordance with the explanations regarding FIG. 2, this foreign material layer 21 can be removed, in a manner not illustrated in more specific detail, and replaced by a further foreign material layer.

Figure 17:
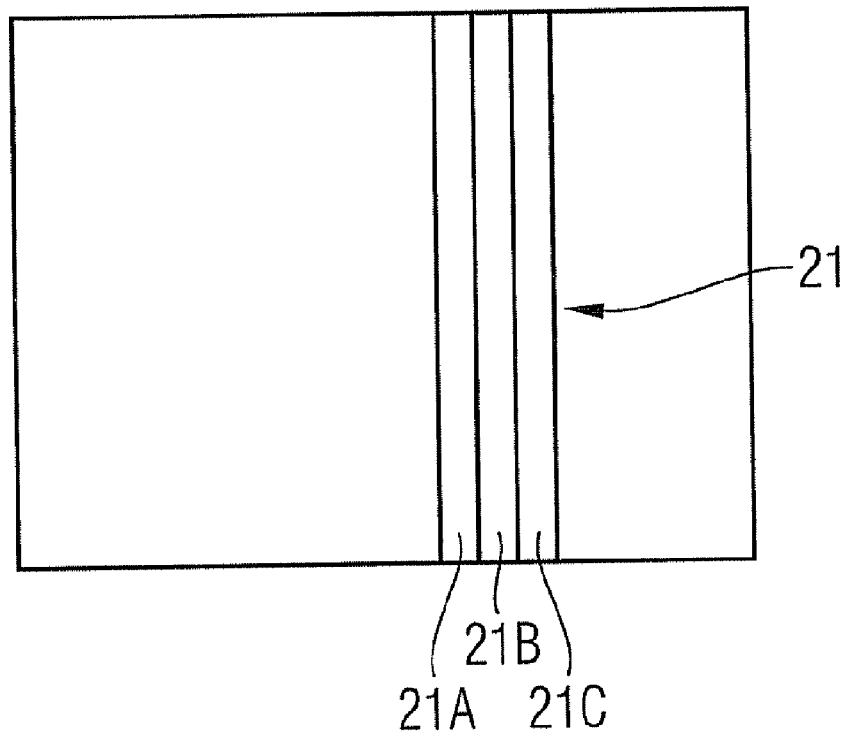
FIG. 17 illustrates a detail illustration of a material layer produced in a semiconductor body, for elucidating a further method for producing a material layer.

One embodiment of the method explained provides for producing the foreign material layers, in one embodiment a first foreign material layer 21', at least in the region of the first trench sidewall 12, as a layer stack. FIG. 17 illustrates an enlarged excerpt from the semiconductor structure in accordance with FIG. 16B for such an exemplary embodiment. The layer stack illustrated includes three partial layers 21A, 21B, 21C, which in the stated order are, for example, a silicon oxide layer, a carbon layer and a silicon oxide layer. Such a layer stack having a carbon layer 21B as the middle layer is suitable particularly in those cases in which the foreign material layer 21 produced is subsequently intended to be removed and replaced by a further foreign material layer. In order to remove such a foreign material layer of layered construction from the trench, firstly the carbon layer 21B is removed. For this purpose, the carbon layer is converted into carbon dioxide, for example, in an oxygen- or ozone-containing environment. After the removal of the carbon layer, the two silicon oxide layers 21A, 21C are uncovered over the entire length of the trench and can then be removed by using a conventional etching material.

The further foreign material layer produced after the removal of the foreign material layer 21 can be an oxide layer, for example. However, the further foreign material layer can also be realized as a layer stack in which firstly a thermally grown oxide layer and then a nitride layer, an oxynitride layer or an aluminum oxide layer ($Al_2O_3$) are produced.

For the case where the gap has not yet been completely filled after the application of the further foreign material layer, optionally a concluding thermal oxidation can also be carried out in order to fill the remainder of the gap. In this case, a thicker insulator layer grows thermally under defect-dictated thin locations of the foreign material layer, which insulator layer shields the defect since the diffusion width for the oxidizing process gas to the silicon interface to be oxidized is smaller at the thin location.

Finally, it should be pointed out that method or component features which have been explained only in connection with one example can be combined with method or component features from other examples even if this has not been explicitly explained previously. Thus, in particular, features represented in one of the following claims can be combined with features of any other claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor component comprising:
   producing a trench, having two opposite sidewalls and a bottom, in the semiconductor body;
   producing a foreign material layer on a first one of the two sidewalls of the trench; and
   filling the trench by epitaxially depositing a semiconductor material onto the second one of the two sidewalls and the bottom of the trench;
   removing the foreign material layer, with the result that a second trench arises; and
   filling the second trench with a further foreign material layer.

2. The method of claim 1, comprising wherein the further foreign material layer is a dielectric layer.

3. A method for producing a semiconductor component comprising:
   producing a trench, having two opposite sidewalls and a bottom, in the semiconductor body;
   producing a foreign material layer on a first one of the two sidewalls of the trench; and
   filling the trench by epitaxially depositing a semiconductor material onto the second one of the two sidewalls and the bottom of the trench;
      wherein after producing the foreign material layer:
         removing the semiconductor body proceeding from a side of the semiconductor body opposite the side proceeding from which the trench is produced, until the foreign material layer is uncovered in sections; and after removing the semiconductor body, introducing dopant atoms of a first and of a second conduction type via a surface of the semiconductor body produced by the removal, into a region of the semiconductor body adjacent to the foreign material layer in a lateral direction of the semiconductor body toward one side or toward both sides, wherein the dopant atoms are introduced such as to produce two semiconductor zones doped complementarily to one another and arranged successively proceeding from the surface of the semiconductor body produced by the removal.

4. The method of claim 3, comprising introducing the dopant atoms such that the semiconductor zones doped complementarily to one another are directly adjacent to one another.

5. The method of claim 3, comprising introducing the dopant atoms in such a way that the semiconductor zones doped complementarily to one another are arranged at a distance from one another.

6. The method of claim 1, comprising wherein the trench runs in elongated fashion in a lateral direction of the semiconductor body.

7. The method of claim 1, comprising wherein the trench runs in ring-shaped fashion.

8. The method of claim 1, comprising:
composing the semiconductor body of monocrystalline silicon; and
producing the trench such that the opposite sidewalls lie in a <010> crystal plane of the silicon crystal lattice of the semiconductor body.

9. A method for producing a semiconductor component comprising:
producing a trench, having two opposite sidewalls and a bottom, in the semiconductor body;
producing a foreign material layer on a first one of the two sidewalls of the trench; and
filling the trench by epitaxially depositing a semiconductor material onto the second one of the two sidewalls and the bottom of the trench;
composing the semiconductor body of monocrystalline silicon; and
producing the trench such that the opposite sidewalls lie in a plane that deviates from a <010> crystal plane of the silicon crystal lattice of the semiconductor body by at most 15°.

10. The method of claim 9, comprising wherein a depth of the trench is between 10 μm and 100 μm.

11. The method of claim 9, comprising wherein a width of the trench is between 0.2 μm and 10 μm.

12. The method of claim 9, comprising wherein a thickness of the foreign material layer is between 10 nm and 200 nm.

13. A method for producing a semiconductor component comprising:
producing a trench, having two opposite sidewalls and a bottom, in the semiconductor body;
producing a foreign material layer on a first one of the two sidewalls of the trench; and
filling the trench by epitaxially depositing a semiconductor material onto the second one of the two sidewalls and the bottom of the trench; and
wherein the semiconductor component comprises a drift zone and a drift control zone and a drift control zone dielectric arranged between the drift zone and the drift control zone, and wherein the foreign material layer forms the drift control zone dielectric.

14. A method for producing a semiconductor component comprising:
producing a trench, having two opposite sidewalls and a bottom, in the semiconductor body;
producing a foreign material layer on a first one of the two sidewalls of the trench; and
filling the trench by epitaxially depositing a semiconductor material onto the second one of the two sidewalls and the bottom of the trench, wherein producing the foreign material layer on the first sidewall comprises:
applying a foreign material layer to both sidewalls and the bottom of the trench; and
removing the foreign material layer from the bottom and from the second sidewall, with the result that the foreign material layer remains on the first sidewall.

15. The method of claim 14, wherein removing the foreign material layer from the bottom of the trench comprises an anisotropic etching.

16. The method of claim 14, wherein removing the foreign material layer from the second sidewall comprises:
producing a protective layer over the foreign material layer in the region of the first sidewall, wherein the protective layer leaves free an auxiliary material layer in the region of the second sidewall; and
carrying out an etching method for removing the foreign material layer in the region of the second sidewall.

17. The method of claim 16, wherein removing the foreign material layer from the second sidewall comprises:
filling the trench such that the foreign material layer is uncovered only in the region of the first side of the semiconductor body;
applying a protective layer to the first side of the semiconductor body, which covers that section of the foreign material layer applied to the first sidewall which is otherwise uncovered on the first side of the semiconductor body and leaves free that section of the foreign material layer applied to the second sidewall which is otherwise uncovered on the first side of the semiconductor body; and
removing the foreign material layer applied to the second side proceeding from the first side of the semiconductor body by using an etching method.

18. A method for producing a semiconductor component comprising:
producing a trench, having two opposite sidewalls and a bottom, in the semiconductor body;
producing a foreign material layer on a first one of the two sidewalls of the trench; and
filling the trench by epitaxially depositing a semiconductor material onto the second one of the two sidewalls and the bottom of the trench, wherein the semiconductor body successively comprises:
a first semiconductor layer;
a second semiconductor layer;
a third semiconductor layer; and
a fourth semiconductor layer, forming a first side of the semiconductor body,
producing the trench such that it extends through the fourth, third and second semiconductor layers right into the first semiconductor layer, and
producing, before filling the trench, a further semiconductor layer in the trench, the layer extending from the bottom of the trench to the level of the third semiconductor layer or the fourth semiconductor layer.

19. The method of claim 18, comprising wherein the first, the third and fourth semiconductor layers are doped semiconductor layers of the same conduction type, and wherein the second semiconductor layer is doped complementarily to the first, third and fourth semiconductor layers.

20. The method of claim 19, comprising:
arranging a further doped semiconductor layer between the second and third semiconductor layers; and
doping more weakly than the second and third semiconductor layers.

21. A method for producing a semiconductor component comprising:
producing a trench, having two opposite sidewalls and a bottom, in the semiconductor body;
producing a foreign material layer on a first one of the two sidewalls of the trench; and
filling the trench by epitaxially depositing a semiconductor material onto the second one of the two sidewalls and the bottom of the trench, wherein producing the foreign material layer comprises:
producing a first foreign material layer, covering the first sidewall of the trench and, outside the trench, a section of a side of the semiconductor body adjacent to the first sidewall, and producing a second foreign material layer, covering the second sidewall of the trench and, outside the trench, a section of a side of the semiconductor body adjacent to the second sidewall;
producing a protective layer, covering the first foreign material layer and which has a cutout in the region of which the second foreign material layer is uncovered in sections;
removing the second foreign material layer at least in the region of the second sidewall using an etchant that is brought into contact with the second foreign material layer via the cutout.

22. The method of claim 21, comprising wherein the protective layer is a carbon layer.

* * * * *